(12) United States Patent
Lee et al.

(10) Patent No.: US 12,237,360 B2
(45) Date of Patent: Feb. 25, 2025

(54) TILED DISPLAY DEVICE

(71) Applicant: Samsung Display Co., LTD., Yongin-si (KR)

(72) Inventors: Jae Been Lee, Seoul (KR); Yi Joon Ahn, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 841 days.

(21) Appl. No.: 17/350,704

(22) Filed: Jun. 17, 2021

(65) Prior Publication Data

US 2022/0045124 A1 Feb. 10, 2022

(30) Foreign Application Priority Data

Aug. 5, 2020 (KR) .................. 10-2020-0098007

(51) Int. Cl.
| | |
|---|---|
| H01L 27/15 | (2006.01) |
| G09F 9/33 | (2006.01) |
| H01L 25/075 | (2006.01) |
| H01L 25/16 | (2023.01) |
| H01L 33/38 | (2010.01) |
| H01L 33/62 | (2010.01) |

(52) U.S. Cl.
CPC .............. *H01L 27/156* (2013.01); *G09F 9/33* (2013.01); *H01L 25/0753* (2013.01); *H01L 25/167* (2013.01); *H01L 33/382* (2013.01); *H01L 33/62* (2013.01)

(58) Field of Classification Search
CPC ..... H01L 27/156; H01L 33/382; H01L 33/62; H01L 25/0753; H01L 25/167; G09F 9/33; G09F 9/302; G09F 9/3026; G09F 9/3023; G02F 1/13336; H10K 59/18
See application file for complete search history.

(56) References Cited

U.S. PATENT DOCUMENTS

| | | | |
|---|---|---|---|
| 2013/0292718 A1* | 11/2013 | Chu | H01L 27/153 438/34 |
| 2016/0104696 A1* | 4/2016 | LaVeigne | G01J 5/024 438/23 |
| 2017/0358602 A1* | 12/2017 | Bae | H05K 1/117 |
| 2018/0164497 A1* | 6/2018 | Zhou | H01L 25/0753 |
| 2020/0020739 A1* | 1/2020 | Chen | H01L 27/156 |
| 2020/0051966 A1* | 2/2020 | Lee | H01L 25/18 |
| 2021/0222861 A1* | 7/2021 | Hsieh | H01L 25/167 |

(Continued)

FOREIGN PATENT DOCUMENTS

| | | | | |
|---|---|---|---|---|
| CN | 111105740 A | * | 5/2020 | ........... G09F 9/3026 |
| WO | WO-2004023568 A1 | * | 3/2004 | ............ H01L 27/15 |

*Primary Examiner* — Scott B Geyer
(74) *Attorney, Agent, or Firm* — KILE PARK REED & HOUTTEMAN PLLC

(57) ABSTRACT

A display device includes display devices each including a display area and a non-display area adjacent to the display area, the display area of each of the display devices including a pixel, and a substrate on which each of the display devices is disposed. Each of the display devices includes a thin film transistor layer disposed on the substrate and including a thin film transistor, and a connection line electrically connected to the thin film transistor and disposed in the non-display area on the substrate. Connection lines of display devices adjacent to each other among the plurality of display devices are disposed staggered with respect to each other.

21 Claims, 16 Drawing Sheets

(56) References Cited

U.S. PATENT DOCUMENTS

2021/0267062 A1* 8/2021 Huang .................. H10K 59/18
2021/0296373 A1    9/2021 Yeon et al.
2022/0367756 A1* 11/2022 Lee ....................... H01L 33/44

* cited by examiner

CTE: CTE1, CTE2

CWL: CWLa, CWLb, CWLc

CWL: CWLa, CWLb, CWLc

TILED DISPLAY DEVICE

CROSS REFERENCE TO RELATED APPLICATION(S)

This application claims priority to and benefits of Korean Patent Application No. 10-2020-0098007 under 35 U.S.C. § 119 filed on Aug. 5, 2020, in the Korean Intellectual Property Office, the entire contents of which are incorporated herein by reference.

BACKGROUND

1. Technical Field

The disclosure relates to a tiled display device.

2. Description of the Related Art

With the development of the information society, requirements for display devices of various forms for displaying images have increased. For example, display devices are applied to various electronic appliances such as smart phones, digital cameras, notebook computers, navigators, and smart televisions. A display device may be a flat panel display device such as a liquid crystal display device, a field emission display device, or a light emitting display device. Since the light emitting display device, among flat panel display devices, includes light emitting elements by which each of the pixels in a display panel emits light by itself, the light emitting display device may display an image or images without a backlight unit that provides light to the display panel.

In a case that a display device is manufactured in a large size, the defective rate of light emitting elements may increase due to an increase in the number of pixels, and productivity or reliability may deteriorate. In order to solve the above problem, a tiled display device may implement a large-sized screen by connecting a plurality of display devices having relatively small sizes. The tiled display device may include a boundary portion called a seam between the plurality of display devices due to the non-display area or bezel area of each of the plurality of display devices adjacent to each other. In a case that a single image is displayed on the entire screen, the boundary portion between the plurality of display devices may create sense or appearance of a disconnection on the entire screen, thereby reducing the immersion of the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure provides a tiled display device capable of removing the sense or appearance of a disconnection between a plurality of display devices and improving the immersion of an image by preventing a boundary portion or non-display area between the plurality of display devices from being visually recognized.

Another aspect of the disclosure is to provide a tiled display device capable of minimizing the electrical interference between connection lines of adjacent display devices.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment, a display device may include a plurality of display devices each including a display area and a non-display area adjacent to the display area, the display area of each of the plurality of display devices including a pixel, and a substrate on which each of the plurality of display devices may be disposed. Each of the plurality of display devices may include a thin film transistor layer disposed on the substrate and including a thin film transistor, and a connection line electrically connected to the thin film transistor and disposed in the non-display area on the substrate. Connection lines of display devices adjacent to each other among the plurality of display devices may be staggered with respect to each other.

The plurality of display devices may comprise a first display device and a second display device adjacent to each other. A plurality of first connection lines disposed at a side surface of the first display device, and a plurality of second connection lines disposed at a side surface of the second display device facing the side surface of the first display device, and the plurality of first connection lines and the plurality of second connection lines may be staggered with respect to each other.

Each of the plurality of first connection lines may correspond to an area between the plurality of second connection lines.

Each of the plurality of first connection lines may face a side surface of the second display device, and each of the plurality of second connection lines may face a side surface of the first display device.

Each of the plurality of first connection lines may be disposed in an odd row, and each of the plurality of second connection lines may be disposed in an even row.

A width of each of the plurality of first connection lines may be smaller than a distance between the plurality of second connection lines.

The first display device may further include a plurality of third connection lines disposed at another side surface of the display device opposite to the side surface of the first display device, and the plurality of first connection lines and the plurality of third connection lines may be symmetrically disposed with respect to the display area.

The first display device may further comprise a plurality of third connection lines disposed at another side surface of the display device opposite to the side surface of the first display device, the plurality of first connection lines and the plurality of third connection lines may be staggered with respect to each other, and the display area may be disposed between the plurality of first connection lines and the plurality of third connection lines.

The plurality of display devices may comprise a first display device and a second display device adjacent to each other. The first display device may comprise a plurality of first line groups each including a plurality of first connection lines and disposed at a side surface of the first display device. The second display device may comprise a plurality of second line groups arranged at one side surface of the second display device each including a plurality of second connection lines and disposed at a side surface of the second display device facing the side surface of the first display device. The plurality of first line groups and the plurality of second line groups may be staggered with respect to each other.

Each of the plurality of first line groups may correspond to an area between the plurality of second line groups.

Each of the plurality of first line groups may face a side surface of the second display device, and each of the plurality of second line groups may face a side surface of the first display device.

Each of the plurality of first line groups may be disposed in an odd row, and each of the plurality of second line groups may be disposed in an even row.

A width of each of the plurality of first line groups may be smaller than a distance between the plurality of second line groups.

The first display device may further comprise a plurality of third line groups disposed at another side surface of the first display device opposite to the side surface of the first display device, and the plurality of first line groups and the plurality of third line groups may be symmetrically disposed with respect to the display area.

The first display device may further comprise a plurality of third line groups disposed at another side surface of the first display device opposite to the side surface of the first display device, the plurality of first line groups and the plurality of third line groups may be staggered with respect to each other, and the display area may be disposed between the plurality of first line groups and the plurality of third line groups.

The connection line may include a first portion electrically connected to the thin film transistor and disposed on the thin film transistor layer, a second portion electrically connected to the first portion and disposed on a side surface of the substrate, and a third portion electrically connected to the second portion and disposed on a lower surface of the substrate.

Each of the plurality of display devices may further comprise a light emitting element and a connection electrode electrically connecting the light emitting element to the thin film transistor, and the first portion of the connection line and the connection electrode may be disposed on a same layer.

Each of the plurality of display devices may further comprise a protection member overlapping the side surface of the substrate and the second portion of the connection line.

Each of the plurality of display devices may further comprise a pad unit disposed on the lower surface of the substrate and electrically connected to the third portion of the connection line, a flexible film disposed on the lower surface of the substrate and electrically connected to the pad unit, and a source driver disposed on the flexible film and supplying a source voltage to the connection line.

The substrate may comprise a recess recessed from a side surface of the substrate. The connection line may include a first portion electrically connected to the thin film transistor and disposed on the thin film transistor layer, a second portion electrically connected to the first portion and disposed in the recess of the substrate, and a third portion electrically connected to the second portion and disposed on a lower surface of the substrate.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
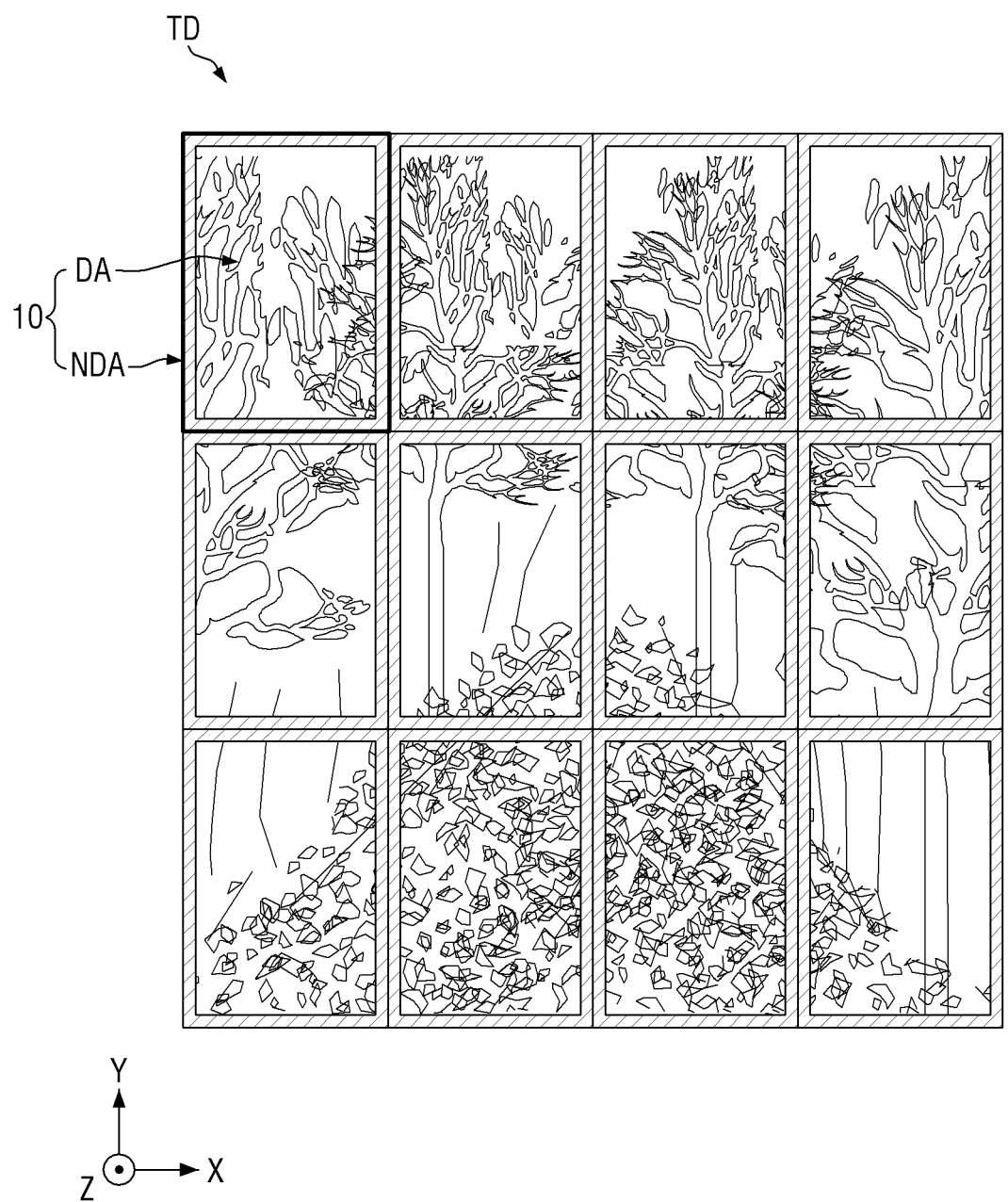
FIG. 1 is a plan view of a tiled display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the descriptions disclosed herein. It is apparent, however, that various embodiments may be practiced without these details or with one or more equivalent arrangements. In other instances, structures and devices may be illustrated in block diagram form in order to avoid unnecessarily obscuring various embodiments. Further, various embodiments may be different, but do not have to be exclusive. For example, shapes, configurations, and characteristics of an embodiment may be used or implemented in an embodiment without departing from the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific or given process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe an element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass an orientation of above and below. Furthermore, the apparatus may be otherwise oriented (for example, rotated 90 degrees or at other orientations), and, as such, the spatially relative descriptors used herein interpreted accordingly.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The terminology used herein is for the purpose of describing various embodiments and is not intended to be limiting. As used herein, the singular forms, "a," "an," and "the" are intended to include the plural forms as well, unless the context clearly indicates otherwise. Moreover, the terms "comprises," "comprising," "includes," "including," and/or "has", "having" and variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the various illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As in the technical field, some or a number of embodiments are described and illustrated in the accompanying drawings in terms of functional blocks, units, and/or modules. Those skilled in the art will appreciate that these blocks, units, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device according to an embodiment.

Referring to FIG. 1, a tiled display device TD may include display devices 10. The display devices 10 may be arranged or disposed in a grid shape, but the disclosure is not limited thereto. The display devices 10 may be connected in a first direction (X-axis direction) or a second direction (Y-axis direction), and the tiled display device TD may have a specific or other shape. For example, each of the display devices 10 may have the same size as each other, but the disclosure is not limited thereto. For another example, the display devices 10 may have different sizes.

Each of the display devices 10 may have a substantially rectangular shape including long and short sides. The display devices 10 may be arranged or disposed with the long or short sides connected to each other. Some or a number of display devices 10 may be disposed on the edge of the tiled display device TD to form one or a side of the tiled display device TD. Some or a number of other display devices 10 may be disposed at corners of the tiled display device TD to form two adjacent sides of the tiled display device TD. Another display device 10 may be disposed inside the tiled display device TD to be surrounded by other display devices 10.

Each of the display devices 10 may include a display area DA and a non-display area NDA. The display area DA may include pixels to display an image. The non-display area NDA may be disposed around the display area DA to surround or to be adjacent to the display area DA and may not display an image.

The tiled display device TD may have a substantially planar shape as a whole, but the disclosure is not limited thereto. The tiled display device TD may have a three-dimensional shape, thereby providing a three-dimensional effect to a user. For example, in a case that the tiled display device TD has a three-dimensional shape, at least some or a number of the display devices 10 may have a substantially curved shape. For another example, the display devices 10 may have a substantially planar shape and may be connected to each other at a predetermined angle, thereby having a three-dimensional shape.

The tiled display device TD may be formed by connecting the non-display areas NDA of the adjacent display devices 10. The display devices 10 may be connected to each other through a connection member or an adhesive member. Therefore, the non-display area NDA between the display devices 10 may be surrounded by the adjacent display areas DA. The distance between the display areas DA of the respective display devices 10 may be short to a degree that the non-display area NDA between the display devices 10 or the boundary portion between the display devices 10 is not recognized by a user. The external light reflectance of the display area DA of each of the display devices 10 may be substantially the same as that of the non-display area NDA between the display devices 10. Therefore, the tiled display device TD may remove the sense or appearance of a disconnection between the display devices 10 and improving or increasing the immersion of an image by preventing the boundary portion or the non-display area NDA between the display devices 10 from being visually recognized.

Figure 2:
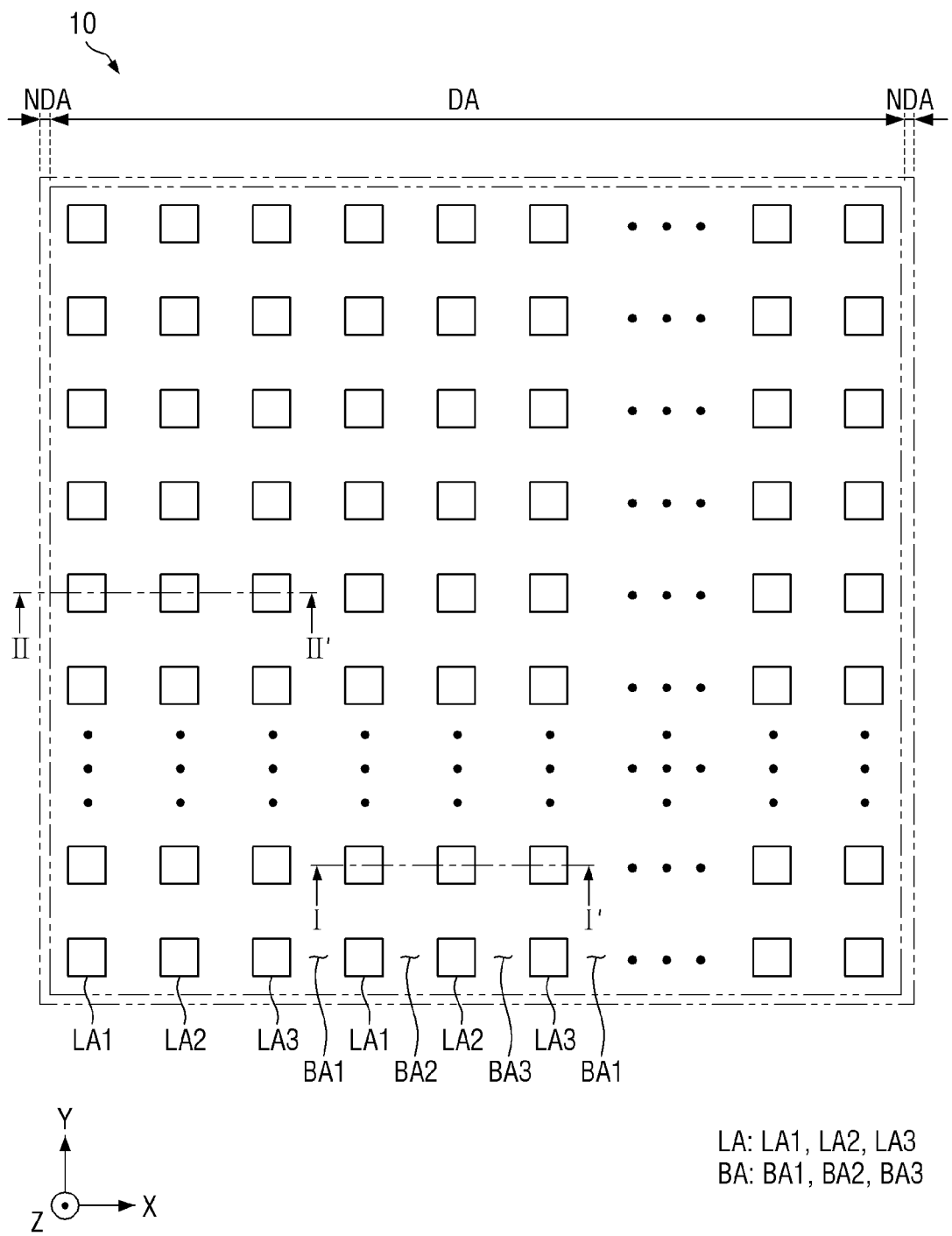
FIG. 2 is a plan view of a display device according to an embodiment.

FIG. 2 is a plan view illustrating a display device according to an embodiment.

Referring to FIG. 2, the display device 10 may include pixels arranged or disposed in the display area DA in rows and columns. Each of the pixels may include a light emitting area LA defined by a pixel defining layer or a bank, and may emit light having a predetermined peak wavelength through the light emitting area LA. For example, the display area DA of the display device 10 may include first to third light emitting areas LA1, LA2, and LA3. Each of the first to third light emitting areas LA1, LA2, and LA3 may be an area in which light generated by a light emitting element of the display device 10 is emitted outside of the display device 10.

The first to third light emitting areas LA1, LA2, and LA3 may emit light having a predetermined peak wavelength outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm. However, the disclosure is not limited thereto.

The first to third light emitting areas LA1, LA2, and LA3 may be repeatedly arranged or disposed sequentially in the first direction (X-axis direction) of the display area DA. For example, the width of the first light emitting area LA1 in the first direction (X-axis direction) may be greater than that of the second light emitting area LA2 in the first direction, and the width of the second light emitting area LA2 in the first direction (X-axis direction) may be greater than that of the third light emitting area LA3 in the first direction (X-axis direction). For an embodiment, the width of the first light emitting area LA1 in the first direction (X-axis direction), the width of the second light emitting area LA2 in the first direction (X-axis direction), and the width of the third light emitting area LA3 in the first direction (X-axis direction) may be substantially the same as each other.

For example, the area of the first light emitting area LA1 may be larger than that of the second light emitting area LA2, and the area of the second light emitting area LA2 may be larger than that of the third light emitting area LA3. For another example, the area of the first light emitting area LA1, the area of the second light emitting area LA2, and the area of the third light emitting area LA3 may be substantially the same as each other.

The display area DA of the display device 10 may include light blocking areas BA surrounding the light emitting areas LA. For example, the display area DA may include first to third light blocking areas BA1, BA2, and BA3. Each of the first to third light-blocking areas BA1, BA2, and BA3 may be disposed at sides of each of the first to third light emitting areas LA1, LA2, and LA3. The first to third light-blocking areas BA1, BA2, and BA3 may prevent mixing of colors of light emitted from the first to third light emitting areas LA1, LA2, and LA3.

Figure 3:
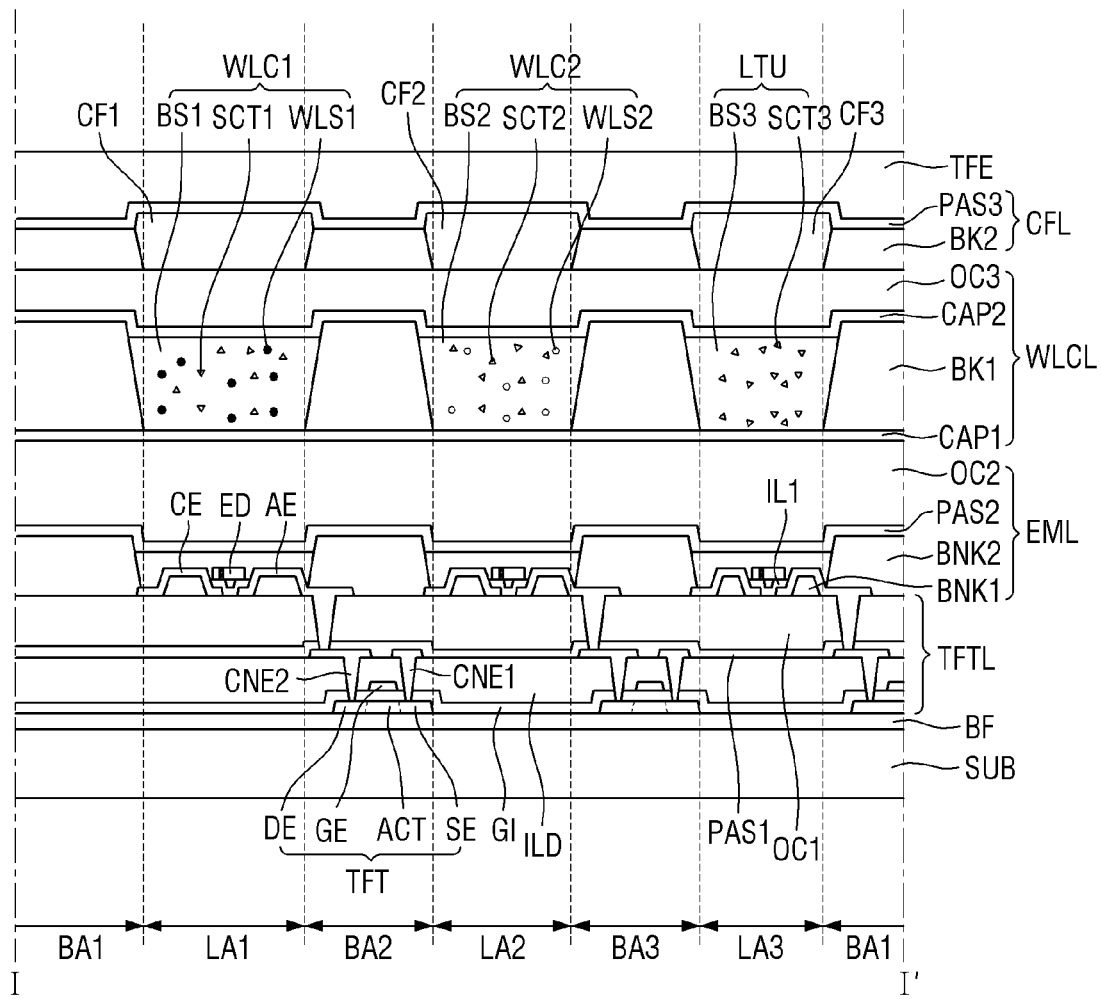
FIG. 3 is a schematic cross-sectional view taken along the line I-I' of FIG. 2.

FIG. 3 is a schematic cross-sectional view taken along line I-I' of FIG. 2.

Referring to FIG. 3, the display area DA of the display device 10 may include the first to third light emitting areas LA1, LA2, and LA3. Each of the first to third light emitting areas LA1, LA2, and LA3 may be an area in which light generated by a light emitting diode ED of the display device 10 is emitted outside of the display device 10.

The display device 10 may include a substrate SUB, a buffer layer BF, a thin film transistor layer TFTL, a light emitting element layer EML, a wavelength conversion layer WLCL, a color filter layer CFL, and an encapsulation layer TFE.

The substrate SUB may be a base plate or a base member and may be made of an insulating material such as a polymer resin. For example, the substrate SUB may be a flexible substrate capable of bending, folding, rolling, or the like within the spirit and the scope of the disclosure. The substrate SUB may include polyimide PI, but the material thereof is not limited thereto.

The buffer layer BF may be disposed on the substrate SUB. The buffer layer BF may be formed of an inorganic film capable of preventing the infiltration of air or moisture. For example, the buffer layer BF may include inorganic films alternately stacked.

The thin film transistor layer TFTL may include a thin film transistor TFT, a gate insulating film GI, an interlayer insulating film ILD, first and second connection electrode CNE1 and CNE2, a first passivation layer PAS1, and a first planarization layer OC1.

The thin film transistor TFT may be disposed on the buffer layer BF and may constitute a pixel circuit of each of pixels. For example, the thin film transistor TFT may be a driving transistor or a switching transistor of a pixel circuit. The thin film transistor TFT may include a semiconductor region ACT, a gate electrode GE, a source electrode SE, and a drain electrode DE.

The semiconductor region ACT, the source electrode SE, and the drain electrode DE may be provided or disposed on the buffer layer BF. The semiconductor region ACT may overlap the gate electrode GE in a thickness direction and may be insulated from the gate electrode GE by the gate insulating film GI. The source electrode SE and the drain electrode DE may be provided by making a material of the semiconductor region ACT into a conductor.

The gate electrode GE may be disposed on the gate insulating film GI. The gate electrode GE may overlap the semiconductor region ACT with the gate insulating film GI interposed therebetween.

The gate insulating film GI may be provided or disposed on the semiconductor region ACT, the source electrode SE, and the drain electrode DE. For example, the gate insulating film GI may cover or overlap the semiconductor region ACT, the source electrode SE, the drain electrode DE, and the buffer layer BF and may insulate the semiconductor region ACT from the gate electrode GE. The gate insulating film GI may include a contact hole through which the first and second connection electrodes CNE1 and CNE2 pass.

The interlayer insulating film ILD may be disposed on the gate electrode GE. For example, the interlayer insulating film ILD may include a contact hole through which the first and second connection electrodes CNE1 and CNE2 pass. Here, the contact hole of the interlayer insulating film ILD may be connected to the contact hole of the gate insulating film GI.

The first and second connection electrodes CNE1 and CNE2 may be disposed on the interlayer insulating film ILD to be spaced apart from each other. The first connection electrode CNE1 may be electrically connected to the source electrode SE of the thin film transistor TFT, and the second connection electrode CNE2 may electrically connect the drain electrode DE of the thin film transistor TFT to a first electrode AE of the light emitting element EL. The first connection electrode CNE1 may electrically contact the source electrode SE through a contact hole provided in the gate insulating film GI and the interlayer insulating film ILD, and the second connection electrode CNE2 may electrically contact the drain electrode DE through a contact hole provided in the gate insulating film GI and the interlayer insulating film ILD.

The first passivation layer PAS1 may be provided or disposed on the first and second connection electrodes CNE1 and CNE2 to protect the thin film transistor TFT. For example, the first passivation layer PAS1 may include a contact hole through which the first electrode AE of the light emitting element EL passes.

The first planarization layer OC1 may be provided or disposed on the first passivation layer PAS1 to planarize the upper end of the thin film transistor layer TFTL. For example, the first planarization layer OC1 may include a contact hole through which the first electrode AE of the light emitting element EL passes. Here, the contact hole of the first planarization layer OC1 may be connected to the contact hole of the first passivation layer PAS1.

The light emitting element layer EML may include a light emitting element EL, a first bank BNK1, a second bank BNK2, a second passivation layer PAS2, and a second planarization layer OC2.

The light emitting element EL may be provided or disposed on the thin film transistor TFT. The light emitting element EL may include the first electrode AE, a second electrode CE, and a light emitting diode ED.

The first electrode AE may be provided or disposed on the first planarization layer OC1. For example, the first electrode AE may be disposed on the first bank BNK1 disposed on the first planarization layer OC1 to cover or overlap the first bank BNK1. The first electrode AE may overlap one of the first to third light emitting areas LA1, LA2, and LA3 defined by the second bank BNK2. The first electrode AE may be electrically connected to the drain electrode DE of the thin film transistor TFT. The first electrode AE may be an anode electrode of the light emitting element EL, but is not limited thereto.

The second electrode CE may be provided or disposed on the first planarization layer OC1 to be spaced apart from the first electrode AE. For example, the second electrode CE may be disposed on the first bank BNK1 disposed on the first planarization layer OC1 to cover or overlap the first bank BNK1. The second electrode CE may overlap one of the first to third light emitting areas LA1, LA2, and LA3 defined by the second bank BNK2. For example, the second electrode CE may receive a common voltage supplied to all of the pixels. The second electrode CE may be a cathode electrode of the light emitting element EL, but is not limited thereto.

A first insulating layer IL1 may cover or overlap a part of the first electrode AE and a part of the second electrode CE, which are adjacent to each other, and may insulate the first electrode AE from the second electrode CE.

The light emitting diode ED may be disposed on the first planarization layer OC1 and between the first electrode AE and the second electrode CE. The light emitting diode ED may be disposed on the first insulating layer IL1. An end of the light emitting diode ED may be electrically connected to the first electrode AE, and the other end of light emitting diode ED may be electrically connected to the second electrode CE. For example, the light emitting diodes ED may include an active layer having the same or similar material to emit light of the same wavelength or light of the same color. The light emitted from each of the first to third light emitting areas LA1, LA2, and LA3 may have the same color. For example, the light emitting diodes ED may emit light of the third color or blue light having a peak wavelength ranging from about 440 nm to about 480 nm. Therefore, the light emitting element layer EML may emit light of the third color or blue light.

The second bank BNK2 may be disposed on the first planarization layer OC1 to define the first to third light emitting areas LA1, LA2, and LA3. The second bank BNK2 may correspond to a pixel defining layer defining the pixels. For example, the second bank BNK2 may surround each of the first to third light emitting areas LA1, LA2, and LA3, but the disclosure is not limited thereto. The second bank BNK2 may separate and insulate the first electrode AE or the second electrode CE of each of the light emitting elements EL. The second bank BNK2 may be disposed in the first to third light blocking areas BA1, BA2, and BA3.

The second passivation layer PAS2 may be disposed on the light emitting elements EL and the second bank BNK2. The second passivation layer PAS2 may cover or overlap the light emitting elements EL and may protect the light emitting elements EL. The second passivation layer PAS2 may prevent the penetration of impurities such as moisture or air from the outside, thereby avoiding damage to the light emitting elements EL.

The second planarization layer OC2 may be provided or disposed on the second passivation layer PAS2 to planarize the upper end of the light emitting element layer EML. The second planarization layer OC2 may include an organic material. For example, the second planarization layer OC2 may include at least one of acrylic resin, epoxy resin, phenolic resin, polyamide resin, and polyimide resin.

The wavelength conversion layer WLCL may include a first capping layer CAP1, a first light blocking member BK1, a first wavelength conversion unit WLC1, a second wavelength conversion unit WLC2, a light transmission unit LTU, a second capping layer CAP2, and a third planarization layer OC3.

The first capping layer CAP1 may be disposed on the second planarization layer OC2 of the light emitting element layer EML. The first capping layer CAP1 may seal the lower surfaces of the first and second wavelength conversion units WLC1 and WLC2 and the light transmission unit LTU. The first capping layer CAP1 may include an inorganic material. For example, the first capping layer CAP1 may include at least one among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking member BK1 may be disposed in the first to third light blocking areas BA1, BA2, and BA3 on the first capping layer CAP1. The first light blocking member BK1 may overlap the second bank BNK2 in the thickness direction. The first light blocking member BK1 may block the transmission of light. The first light blocking member BK1 may prevent light from traveling between the first to third light emitting areas LA1, LA2, and LA3 and mixing colors thereof, thereby improving or increasing color reproducibility. The first light blocking member BK1 may be disposed in a lattice shape surrounding the first to third light emitting areas LA1, LA2, and LA3 on a plane.

The first light blocking member BK1 may include an organic light blocking material and a liquid repellent component. Here, the liquid repellent component may include a fluorine-containing monomer or a fluorine-containing polymer, and by way of example, may include a fluorine-containing aliphatic polycarbonate. For example, the first light blocking member BK1 may be made of a black organic material including a liquid repellent component. The first light blocking member BK1 may be formed through a coating and exposure process for an organic light blocking material including a liquid repellent component.

The first light blocking member BK1 may include a liquid repellent component, thereby separating the first and second wavelength conversion units WLC1 and WLC2 and the light transmission unit LTU into the corresponding light emitting areas LA. For example, in a case that the first and second wavelength conversion units WLC1 and WLC2 and the light transmission unit LTU are formed by an inkjet method, an ink composition may flow on the upper surface of the first light blocking member BK1. In this case, the first light blocking member BK1 may include the liquid repellent component, thereby guiding the ink composition such that the same flow to the respective light emitting areas LA. Therefore, the first light blocking member BK1 may prevent the ink composition from being mixed.

The first wavelength conversion unit WLC1 may be disposed in the first light emitting area LA1 on the first capping layer CAP1. The first wavelength conversion unit WLC1 may be surrounded by the first light blocking member BK1. The first wavelength conversion unit WLC1 may include a first base resin BS1, a first scatterer SCT1, and a first wavelength shifter WLS1.

The first base resin BS1 may include a material having relatively high light transmittance. The first base resin BS1 may include a transparent organic material. For example, the first base resin BS1 may include at least one among organic materials such as epoxy resin, acrylic resin, cardo resin, and imide resin.

The first scatterer SCT1 may have a different refractive index from the first base resin BS1 and may form an optical interface with the first base resin BS1. For example, the first scatterer SCT1 may include a light scattering material or light scattering particles scattering at least a part of transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or may include organic particles such as acrylic resin particles or urethane resin particles. The first scatterer SCT1 may scatter light in a random direction irrespective of the incident direction of incident light, without substantially changing the peak wavelength of incident light.

The first wavelength shifter WLS1 may convert or shift the peak wavelength of incident light to a first peak wavelength. For example, the first wavelength shifter WLS1 may convert blue light, provided from the display device 10, into red light having a single peak wavelength ranging from about 610 nm to about 650 nm and may emit the red light. The first wavelength shifter WLS1 may be a quantum dot, a quantum rod, or a phosphor. The quantum dot may be a particulate material emitting light of a specific or predetermined color as electrons transition from a conduction band to a valence band.

For example, the quantum dot may be a semiconductor nanocrystalline material. The quantum dot may have a specific or predetermined band gap according to the composition and size thereof to absorb light and then emit light having a unique wavelength.

Examples of semiconductor nanocrystals of the quantum dot may include group IV nanocrystals, group II-VI compound nanocrystals, group III-V compound nanocrystals, group IV-VI nanocrystals, and combinations thereof.

For example, the quantum dot may have a core-shell structure including a core including the above-described nanocrystals and a shell surrounding the core. The shell of the quantum dot may serve as a protective layer for maintaining semiconductor properties by preventing the chemical denaturation of the core and may serve as a charging layer for imparting electrophoretic properties to the quantum dot. The shell may be a monolayer or multiple layers. The interface between the core and the shell may have a concentration gradient in which the concentration of elements in the shell decreases toward the center of the shell. The shell of the quantum dot may be made of a metal or non-metal oxide, a semiconductor compound, or combinations thereof.

The light emitted by the first wavelength shifter WLS1 may have a light emission wavelength spectrum full width of half maximum (FWHM) of about 45 nm or less, or about 40 nm or less, or about 30 nm or less, and thus the color purity and color reproducibility of the color displayed by the display device 10 may be further improved or increased. The light emitted by the first wavelength shifter WLS1 may be emitted in various directions regardless of the incident direction of incident light. Therefore, the side visibility of the red color displayed in the first light emitting area LA1 may be improved or may be increased.

A part of the blue light provided from the light emitting element layer EML may transmit the first wavelength conversion unit WLC1 without being converted into red light by the first wavelength shifter WLS1. In the blue light provided from the light emitting element layer EML, light having been incident on a first color filter CF1 without being converted by the first wavelength conversion unit WLC1 may be blocked by the first color filter CF1. Further, in the blue light provided from the light emitting element layer EML, red light converted by the first wavelength conversion unit WLC1 may be emitted to the outside through the first color filter CF1. Therefore, the first light emitting area LA1 may emit red light.

The second wavelength conversion unit WLC2 may be disposed in the second light emitting area LA2 on the first capping layer CAP1. The second wavelength conversion unit WLC2 may be surrounded by the first light blocking member BK1. The second wavelength conversion unit WLC2 may include a second base resin BS2, a second scatterer SCT2, and a second wavelength shifter WLS2.

The second base resin BS2 may include a material having relatively high light transmittance. The second base resin BS2 may include a transparent organic material. For example, the second base resin BS2 may include the same or similar material as the first base resin BS1 or may include the material exemplified in the first base resin BS1.

The second scatterer SCT2 may have a different refractive index from the second base resin BS2 and may form an optical interface with the second base resin BS2. For example, the second scatterer SCT2 may include a light scattering material or light scattering particles scattering at least a part of transmitted light. For example, the second scatterer SCT2 may include the same or similar material as the first scatterer SCT1, or may include the material exemplified in the first scatterer SCT1. The second scatterer SCT2 may scatter light in a random direction irrespective of the incident direction of incident light, without substantially changing the peak wavelength of incident light.

The second wavelength shifter WLS2 may convert or shift the peak wavelength of incident light to a second peak wavelength different from the first peak wavelength of the first wavelength shifter WLS1. For example, the second wavelength shifter WLS2 may convert blue light, provided from the display device 10, into green light having a single peak wavelength ranging from about 510 nm to about 550 nm and may emit the green light. The second wavelength shifter WLS2 may be a quantum dot, a quantum rod, or a phosphor. The second wavelength shifter WLS2 may include the same or similar material as the material exemplified in the first wavelength shifter WLS1. The second wavelength shifter WLS2 may be formed as a quantum dot, a quantum rod, or a phosphor such that the wavelength conversion range of the second wavelength shifter WLS2 may be different from that of the first wavelength shifter WLS1.

The light transmission unit LTU may be disposed in the third light emitting area LA3 on the first capping layer CAP1. The light transmission unit LTU may be surrounded by the first light blocking member BK1. The light transmission unit LTU may transmit incident light while maintaining the peak wavelength of the incident light. The light transmission unit LTU may include a third base resin BS3 and a third scatterer SCT3.

The third base resin BS3 may include a material having relatively high light transmittance. The third base resin BS3 may include a transparent organic material. For example, the third base resin BS3 may include the same or similar material as the first base resin BS1 or the second base resin BS2, or may include the material exemplified in the first base resin BS1 or the second base resin BS2.

The third scatterer SCT3 may have a different refractive index from the third base resin BS3 and may form an optical interface with the third base resin BS3. For example, the third scatterer SCT3 may include a light scattering material or light scattering particles scattering at least a part of transmitted light. For example, the third scatterer SCT3 may include the same or similar material as the first scatterer SCT1 or the second scatterer SCT2, or may include the material exemplified in the first scatterer SCT1 or the second scatterer SCT2. The third scatterer SCT3 may scatter light in a random direction irrespective of the incident direction of incident light, without substantially changing the peak wavelength of incident light.

The wavelength conversion layer WLCL may be directly disposed on the second planarization layer OC2 of the light emitting element layer EML, and thus the display device 10 may not require a separate substrate for the first and second wavelength conversion units WLC1 and WLC2 and the light transmission unit LTU. Therefore, the first and second wavelength conversion units WLC1 and WLC2 and the light transmission unit LTU may be easily aligned with the respective first to third light emitting areas LA1, LA2, and LA3, and the thickness of the display device 10 may be relatively reduced.

The second capping layer CAP2 may cover or overlap the first and second wavelength conversion units WLC1 and WLC2, the light transmission unit LTU, and the first light blocking member BK1. For example, the second capping layer CAP2 may encapsulate the first and second wavelength conversion units WLC1 and WLC2 and the light transmission unit LTU to prevent the first and second wavelength conversion units WLC1 and WLC2 and the light transmission unit LTU from being damaged or contaminated. The second capping layer CAP2 may include the same or similar material as the first capping layer CAP1, or may include the material exemplified in the first capping layer CAP1.

The third planarization layer OC3 may be provided or disposed on the second capping layer CAP2 to planarize the upper ends of the first and second wavelength conversion units WLC1 and WLC2 and the light transmission unit LTU. The third planarization layer OC3 may include an organic material. For example, the third planarization layer OC3 may include at least one among acrylic resin, epoxy resin, phenolic resin, polyamide resin, and polyimide resin.

The color filter layer CFL may include a second light blocking member BK2, first to third color filters CF1, CF2, and CF3, and a third passivation layer PAS3.

The second light blocking member BK2 may be disposed in the first to third light blocking areas BA1, BA2, and BA3 on the third planarization layer OC3 of the wavelength conversion layer WLCL. The second light blocking member BK2 may overlap the first light blocking member BK1 or the second bank BNK2 in the thickness direction. The second light blocking member BK2 may block the transmission of light. The second light blocking member BK2 may prevent light from traveling between the first to third light emitting areas LA1, LA2, and LA3 and mixing colors thereof, thereby improving or increasing color reproducibility. The second light blocking member BK2 may be disposed in a lattice shape surrounding the first to third light emitting areas LA1, LA2, and LA3 on a plane.

The first color filter CF1 may be disposed in the first light emitting area LA1 on the third planarization layer OC3. The first color filter CF1 may be surrounded by the second light blocking member BK2. The first color filter CF1 may overlap the first wavelength conversion unit WLC1 in the thickness direction. The first color filter CF1 may selectively transmit light of the first color (for example, red light) and may block or absorb light of the second color (for example, green light) and light of the third color (for example, blue light). For example, the first color filter CF1 may be a red color filter and may include a red colorant. The red colorant may be made of a red dye or a red pigment.

The second color filter CF2 may be disposed in the second light emitting area LA2 on the third planarization layer OC3. The second color filter CF2 may be surrounded by the second light blocking member BK2. The second color filter CF2 may overlap the second wavelength conversion unit WLC2 in the thickness direction. The second color filter CF2 may selectively transmit light of the second color (for example, green light) and may block or absorb light of the first color (for example, red light) and light of the third color (for example, blue light). For example, the second color filter CF2 may be a green color filter and may include a green colorant. The green colorant may be made of a green dye or a green pigment.

The third color filter CF3 may be disposed in the third light emitting area LA3 on the third planarization layer OC3. The third color filter CF3 may be surrounded by the second light blocking member BK2. The third color filter CF3 may overlap the light transmission unit LTU in the thickness direction. The third color filter CF3 may selectively transmit light of the third color (for example, blue light) and may block or absorb light of the first color (for example, red light) and light of the second color (for example, green light). For example, the third color filter CF3 may be a blue color filter and may include a blue colorant. The blue colorant may be made of a blue dye or a blue pigment.

The first to third color filters CF1, CF2, and CF3 may absorb a part of light from the outside of the display device 10 to reduce reflected light due to external light. Therefore, the first to third color filters CF1, CF2, and CF3 may prevent color distortion due to reflection of external light.

The first to third color filters CF1, CF2, and CF3 may be directly disposed on the third planarization layer OC3 of the wavelength conversion layer WLCL, and thus the display device 10 may not require a separate substrate for the first to third color filters CF1, CF2, and CF3. Therefore, the thickness of the display device 10 may be relatively reduced.

The third passivation layer PAS3 may cover or overlap the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may cover or overlap the upper and side surfaces of a display layer. For example, the encapsulation layer TFE may include at least one inorganic film to prevent the permeation of oxygen or moisture. Further, the encapsulation layer TFE may include at least one organic film to protect the display device 10 from foreign matter such as dust.

Figure 4:
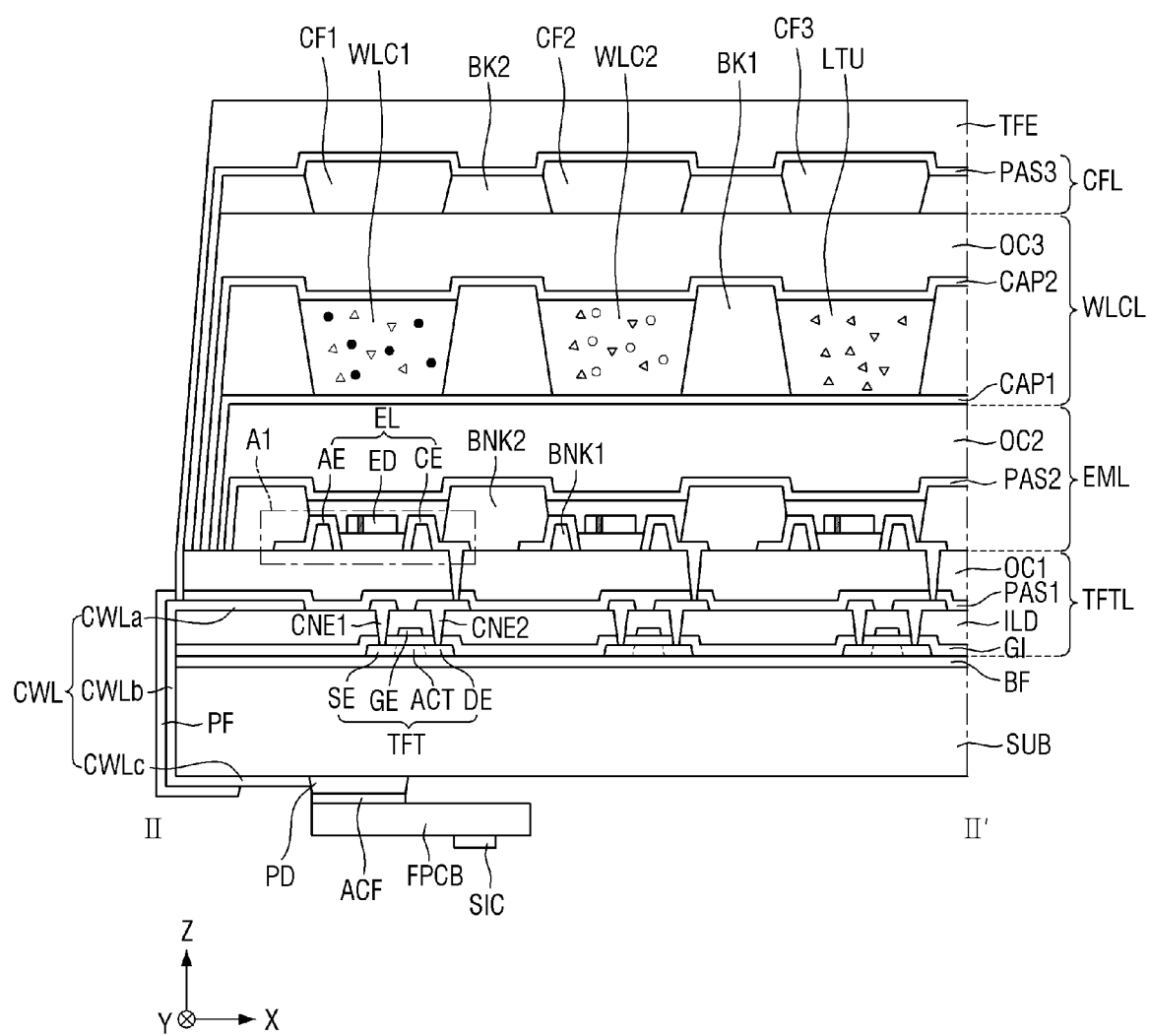
FIG. 4 is a schematic cross-sectional view taken along the line II-II' of FIG. 2.

FIG. 4 is a schematic cross-sectional view taken along line II-II' of FIG. 2. Hereinafter, the same configuration as the above-described configuration will be briefly described or omitted.

Referring to FIG. 4, the display device 10 may include a substrate SUB, a buffer layer BF, a thin film transistor layer TFTL, a light emitting element layer EML, a wavelength conversion layer WLCL, a color filter layer CFL, and an encapsulation layer TFE. The display device 10 may further include a connection line CWL, a protection member PF, a pad unit PD, a flexible film FPCB, and a source driver SIC.

The connection line CWL may electrically connect a thin film transistor TFT of the thin film transistor layer TFTL to the pad unit PD disposed on the lower surface of the substrate SUB. The connection line CWL may supply an electric signal, received from the pad unit PD, to the thin film transistor TFT. The connection line CWL may be electrically connected to data lines to supply a data voltage. For example, the connection line CWL may be formed of the same or similar material as the first and second connection electrodes CNE1 and CNE2 of the thin film transistor layer TFTL in the same layer thereas, but the disclosure is not limited thereto. The connection line CWL may be electrically connected to the first connection electrode CNE1 of the thin film transistor layer TFTL through a data line.

The connection line CWL may include a first portion CWLa, a second portion CWLb, and a third portion CWLc.

The first portion CWLa of the connection line CWL may be disposed in the non-display area NDA of the thin film transistor layer TFTL. The first portion CWLa of the connection line CWL may be electrically connected to data lines. For example, the first portion CWLa of the connection line CWL may be disposed on the interlayer insulating film ILD and thus may be formed of the same or similar material as the first and second connection electrodes CNE1 and CNE2 of the thin film transistor layer TFTL in the same layer thereas.

The second portion CWLb of the connection line CWL may be disposed between the first portion CWLa and the third portion CWLc. The second portion CWLb of the connection line CWL may extend from the upper side surface of the substrate SUB to the lower side surface of the substrate SUB, thereby electrically connecting the first portion CWLa of the connection line CWL, disposed on the thin film transistor layer TFTL, to the third portion CWLc of the connection line CWL disposed on the lower surface of the substrate SUB. For example, the second portion CWLb of the connection line CWL may be disposed on the side surfaces of the interlayer insulating film ILD, the gate insulating film GI, the buffer layer BF, and the substrate SUB.

The third portion CWLc of the connection line CWL may be disposed on the lower surface of the substrate SUB to electrically connect the second portion CWLb of the connection line CWL to the pad unit PD. Therefore, an electrical signal supplied from the pad unit PD may sequentially pass through the third portion CWLc, the second portion CWLb, and the first portion CWLa of the connection line CWL and may be transmitted to the thin film transistor TFT.

The protection member PF may cover or overlap the side surface of the substrate SUB and the second portion CWLb of the connection line CWL. The protection member PF may protect the second portion CWLb of the connection line CWL exposed from the side surface of the substrate SUB. For example, the protection member PF may be disposed on the entire side surface of the substrate SUB to protect the connection lines CWL. As another example, the protection member PF may cover or overlap each of the connection lines CWL and protect the corresponding connection line CWL.

The pad unit PD may be disposed on the lower surface of the substrate SUB. The pad unit PD may receive various voltages or signals from the flexible film FPCB and may supply the corresponding voltages or signals to the thin film transistor TFT through the connection line CWL. Therefore, the display device 10 may not include an additional pad unit disposed at the outermost side thereof, and the non-display area NDA, bezel area, or dead space of the display device 10 may be minimized. Since the pad unit PD may be disposed on the lower surface of the display device 10 and electrically connected to the thin film transistor TFT through the connection line CWL, the interval between the display devices 10 may be further reduced, compared to in a case that the pad unit PD is disposed on the outermost side of the substrate SUB or in a case that the flexible film FPCB is disposed on the side or a side surface of the substrate SUB.

An adhesive film ACF may attach the flexible film FPCB to the pad unit PD. A surface of the adhesive film ACF may be attached to the pad unit PD, and the other surface of the adhesive film ACF may be attached to the flexible film FPCB. For example, the adhesive film ACF may cover or overlap the entire pad unit PD, but the disclosure is not limited thereto.

The adhesive film ACF may include an anisotropic conductive film. In a case that the adhesive film ACF may include an anisotropic conductive film, the adhesive film ACF may have conductivity in an area where the pad unit PD contacts the contact pad of the flexible film FPCB, and may electrically connect the flexible film FPCB to the pad unit PD.

The flexible film FPCB may be disposed on the lower surface of the substrate SUB. A side of the flexible film FPCB may be electrically connected to the pad unit PD, and the other side of the flexible film FPCB may be electrically connected to a source circuit board (not illustrated) on the lower surface of the substrate SUB. The flexible film FPCB may transmit a signal of the source driver SIC to the display device 10. For example, the source driver SIC may be an integrated circuit (IC). The source driver SIC may convert digital video data into an analog data voltage based on a source control signal of a timing controller and may supply the analog data voltage to the thin film transistor TFT of the display area DA through the flexible film FPCB.

Figure 5:
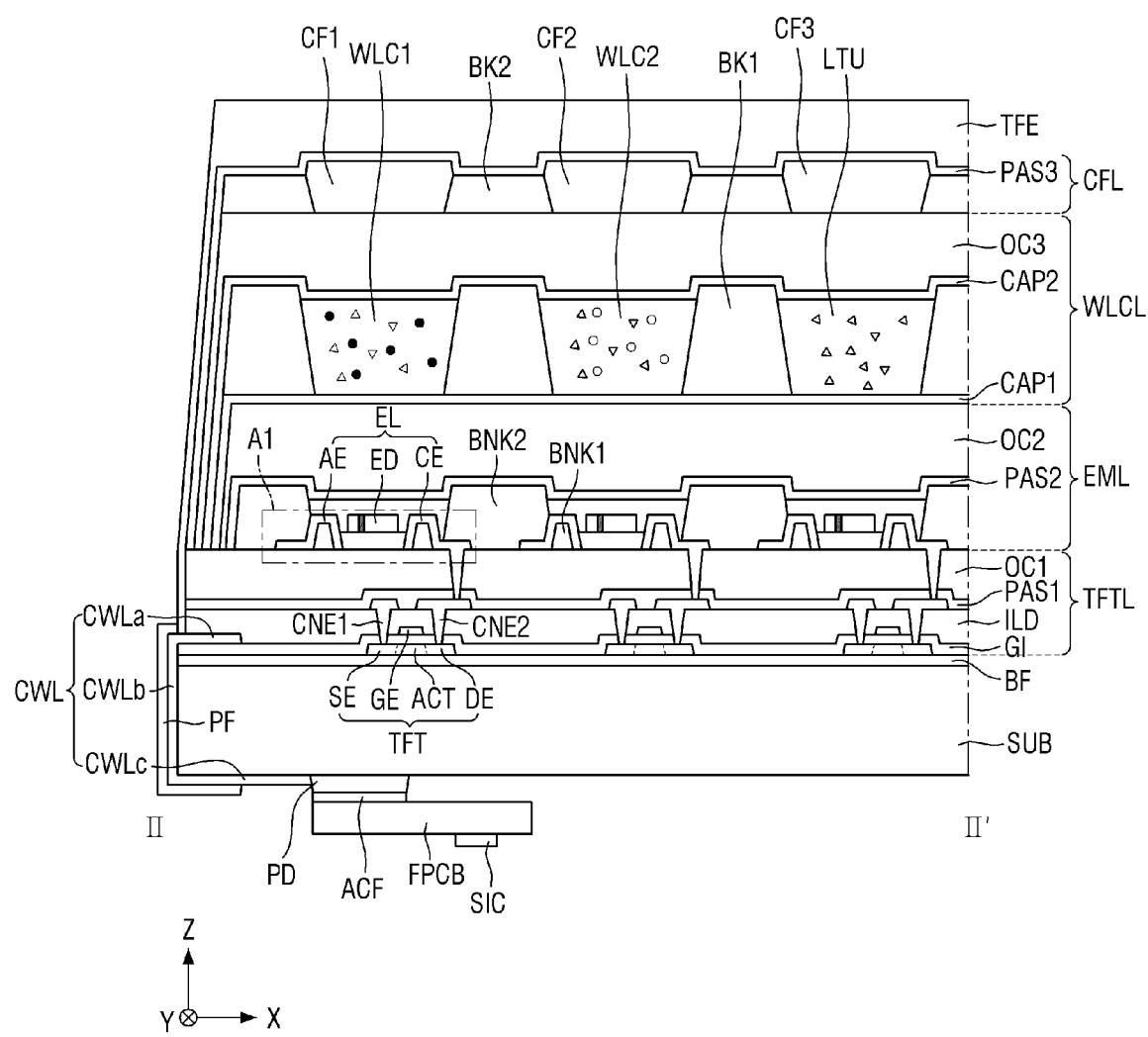
FIG. 5 is another schematic cross-sectional view taken along the line II-II' of FIG. 2.

FIG. 5 is another schematic cross-sectional view taken along line II-II' of FIG. 2. The display device of FIG. 5 may be different from that of FIG. 4 in the configuration of the connection line CWL. Therefore, the same configuration as the above-described configuration will be briefly described or omitted.

The connection line CWL may electrically connect a thin film transistor TFT of the thin film transistor layer TFTL to the pad unit PD disposed on the lower surface of the substrate SUB. The connection line CWL may supply an electric signal, received from the pad unit PD, to the thin film transistor TFT. The connection line CWL may be electrically connected to scan lines to supply a scan signal. For example, the connection line CWL may be formed of the same or similar material as the gate electrode GE of the thin film transistor TFT in the same layer thereas, but the disclosure is not limited thereto. The connection line CWL may be electrically connected to the gate electrode GE of the thin film transistor TFT through the scan lines.

The connection line CWL may include a first portion CWLa, a second portion CWLb, and a third portion CWLc.

The first portion CWLa of the connection line CWL may be disposed in the non-display area NDA of the thin film transistor layer TFTL. The first portion CWLa of the connection line CWL may be electrically connected to scan lines. For example, the first portion CWLa of the connection line CWL may be disposed on the gate insulating film GI and thus may be formed of the same or similar material as the gate electrode GE of the thin film transistor TFT in the same layer thereas.

Figure 6:
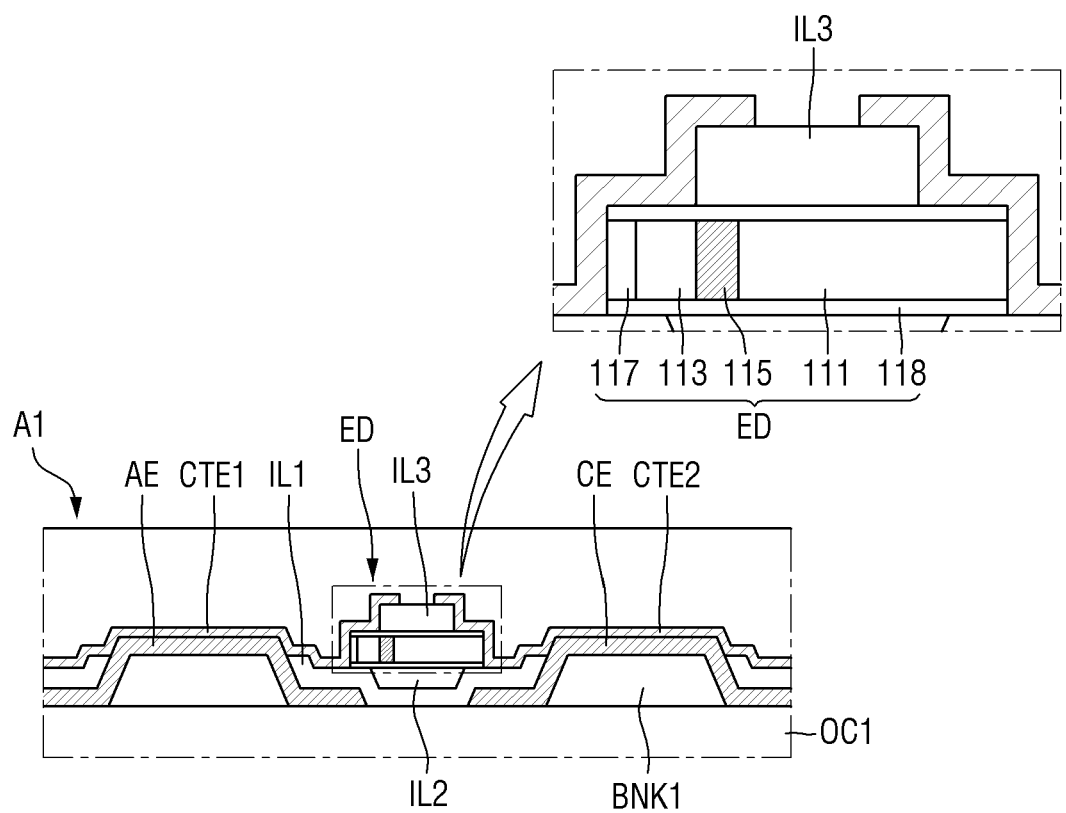
FIG. 6 is an enlarged view of area A1 of FIG. 4.

FIG. 6 is a schematic enlarged view of area A1 of FIG. 4.

Referring to FIG. 6, the light emitting element layer EML of the display device 10 may be disposed on the thin film transistor layer TFTL and may include first to third insulating layers IL1, IL2, and IL3.

The first banks BNK1 may be disposed in each of the first to third light emitting areas LA1, LA2, and LA3. Each of the first banks BNK1 may correspond to the first electrode AE or the second electrode CE. The first banks BNK1 may be disposed on the first planarization layer OC1, and the side surface of each of the first banks BNK1 may be inclined from the first planarization layer OC1. Each of the first and second electrodes AE and CE may be disposed on the corresponding first bank BNK1. The first bank BNK1 may include polyimide (PI), but the material thereof is not limited thereto.

The first and second electrodes AE and CE may include a transparent conductive material. For example, each of the first and second electrodes AE and CE may include at least one among indium tin oxide (ITO), indium zinc oxide (IZO), and indium tin-zinc oxide (ITZO), but the material thereof is not limited thereto.

The first and second electrodes AE and CE may include a conductive material having high reflectance. For example, the first and second electrodes AE and CE may include a metal such as silver (Ag), copper (Cu), or aluminum (Al), having high reflectance. The first and second electrodes AE and CE may reflect light incident from the light emitting diode ED in an upward direction of the display device 10.

The first and second electrodes AE and CE may have a structure in which at least one layer made of a transparent conductive material and at least one layer made of a metal having high reflectance are stacked, or may be formed as a single layer including the transparent conductive material and the metal having high reflectance. For example, the first and second electrodes AE and CE have a stacked structure of ITO, silver (Ag), ITO, and IZO or may be an alloy including aluminum (Al), nickel (Ni), or lanthanum (La), but the material thereof is not limited thereto.

The first insulating layer IL1 may be disposed on the first planarization layer OC1, the first electrode AE, and the second electrode CE. The first insulating layer IL1 may cover or overlap a part of each of the first and second electrodes AE and CE. For example, the first insulating layer IL1 may expose or allow parts of the first and second electrodes AE and CE corresponding to the upper surface of the first bank BNK1 to be exposed and may cover or overlap parts of the first and second electrodes AE and CE not corresponding to the upper surface of the first bank BNK1. Therefore, the first insulating layer IL1 may include an opening for exposing the parts of the first and second electrodes AE and CE corresponding to the upper surface of the first bank BNK1.

For example, the first insulating layer IL1 may include an inorganic insulating material and may include a recessed step between the first and second electrodes AE and CE. The second insulating layer IL2 may fill the recessed step of the first insulating layer ILL Therefore, the second insulating layer IL2 may planarize the upper surface of the first insulating layer ILL and the light emitting diode ED may be disposed on the first and second insulating layers IL1 and IL2.

The first insulating layer IL1 may protect the first and second electrodes AE and CE and insulate the first and second electrodes AE and CE from each other. The first insulating layer IL1 may prevent the light emitting diode ED from being damaged by direct contact with other members.

The light emitting diode ED may be disposed between the first electrode AE and the second electrode CE on the first and second insulating layers IL1 and IL2. An end of the light emitting diode ED may be electrically connected to the first electrode AE, and the other end of the light emitting diode ED may be electrically connected to the second electrode CE. For example, the light emitting diode ED may be electrically connected to the first electrode AE through the first contact electrode CTE1 and may be electrically connected to the second electrode CE through the second contact electrode CTE2.

The light emitting diode ED may have a size of a micrometer or nanometer and may be an inorganic light emitting diode including an inorganic material. The inorganic light emitting diode may be aligned between two electrodes, facing each other, according to an electric field formed in a specific or given direction between the two electrodes.

The light emitting diode ED may include a first semiconductor layer 111, a second semiconductor layer 113, an active layer 115, an electrode layer 117, and an insulating layer 118.

The first semiconductor layer 111 may include an n-type semiconductor. For example, in a case that the light emitting diode ED emits blue light, the first semiconductor layer 111 may include a semiconductor material having the formula $Al_xGa_yIn_{1-x-y}N$ ($0 \le x \le 1$, $0 \le y \le 1$, $0 \le x+y \le 1$). The first semiconductor layer 111 may include at least one semiconductor material among AlGaInN, GaN, AlGaN, InGaN, AlN, and InN, which are doped with an n-type dopant. The first semiconductor layer 111 may be doped with an n-type dopant such as Si, Ge, or Sn. The first semiconductor layer 111 may include n-GaN doped with Si, which is an n-type dopant. The length of the first semiconductor layer 111 may range from about 1.5 μm to about 5 μm, but is not limited thereto.

The second semiconductor layer 113 may be disposed on the active layer 115. For example, in a case that the light emitting diode ED emits blue or green light, the second semiconductor layer 113 may include a semiconductor material having the formula $Al_xGa_yIn_{1-x-y}N$ ($0 \le x \le 1$, $0 \le y \le 1$, $0 \le x+y \le 1$). The second semiconductor layer 113 may include at least one semiconductor material among AlGaInN, GaN, AlGaN, InGaN, AlN, and InN, which are doped with a p-type dopant. The second semiconductor layer 113 may be doped with a p-type dopant such as Mg, Zn, Ca, Se, or Ba. The second semiconductor layer 113 may include p-GaN doped with Mg, which is a p-type dopant. The length of the second semiconductor layer 113 may range from about 0.05 μm to about 0.10 μm, but is not limited thereto.

Each of the first and second semiconductor layers 111 and 113 may be formed as a single layer, but the disclosure is not limited thereto. For example, each of the first and second semiconductor layers 111 and 113 may have multiple layers including a clad layer or a tensile strain barrier reducing (TSBR) layer.

The active layer 115 may be disposed between the first and second semiconductor layers 111 and 113. The active layer 115 may include a material having a single or multiple quantum well structure. In a case that the active layer 115 may include a material having a multiple quantum well structure, quantum layers and well layers may be alternately stacked. The active layer 115 may emit light by the combination of electron-hole pairs according to electrical signals applied through the first and second semiconductor layers 111 and 113. For example, in a case that the active layer 115 emits blue light, the active layer 115 may include a material such as AlGaN or AlGaInN. In a case that the active layer 115 is a multiple quantum well structure in which quantum layers and well layers are alternately stacked, the quantum layers may include a material such as AlGaN or AlGaInN, and the well layers may include a material such as GaN or AlInN. The active layer 115 may emit blue light by including quantum layers containing AlGaInN and well layers containing AlInN.

For another example, the active layer 115 may have a structure in which semiconductor materials having large band gap energy and semiconductor materials having small band gap energy are alternately stacked, and may include group III to V semiconductor materials according to a wavelength band of emitted light. The light emitted from the active layer 115 is not limited to blue light and may be red or green light in some or a number of embodiments. The length of the active layer 115 may range from about 0.05 μm to about 0.10 μm, but is not limited thereto.

The light emitted from the active layer 115 may be emitted in the length direction of the light emitting diode ED and may also be emitted to sides of the light emitting diode ED. The direction of the light emitted from the active layer 115 may not be limited.

The electrode layer 117 may include an ohmic contact electrode. For another example, the electrode layer 117 may include a Schottky contact electrode. The light emitting diode ED may include at least one electrode layer 117. In a case that the light emitting diode ED is electrically connected to the electrode or a contact electrode CTE, the electrode layer 117 may reduce the resistance between the light emitting diode ED and the electrode or the contact electrode CTE. The electrode layer 117 may include a conductive metal. For example, the electrode layer 117 may include at least one among aluminum (Al), titanium (Ti), indium (In), gold (Au), silver (Ag), indium tin oxide (ITO), indium zinc oxide (IZO), and indium tin-zinc oxide (ITZO). The electrode layer 117 may include a semiconductor material doped with an n- or p-type dopant.

The insulating layer 118 may surround the outer surfaces of the semiconductor layers and the electrode layers. The insulating layer 118 may surround the outer surface of the active layer 115 and may extend in a direction in which the light emitting diode ED may extends. The insulating layer 118 may protect the light emitting diode ED. For example, the insulating layer 118 may surround the side surface of the light emitting diode ED and may expose or allow both longitudinal ends of the light emitting diode ED to be exposed.

The insulating layer 118 may include materials having insulating properties, for example, silicon oxide (SiOx), silicon nitride (SiNx), silicon oxynitride (SiOxNy), aluminum nitride (MN), and aluminum oxide ($Al_2O_3$). Therefore, the insulating layer 118 may prevent an electrical short circuit that may occur in a case that the active layer 115 directly contacts an electrode through which an electrical signal is transmitted to the light emitting diode ED. Further, the insulating layer 118 may include the active layer 115 to protect the outer surface of the light emitting diode ED, thereby preventing the reduction in light emission efficiency.

The third insulating layer IL3 may be partially disposed on the light emitting diode ED disposed between the first and second electrodes AE and CE. The third insulating layer IL3 may partially cover or overlap the outer surface of the light emitting diode ED. The third insulating layer IL3 may protect the light emitting diode ED.

The contact electrode CTE may include first and second contact electrodes CTE1 and CTE2. The first contact electrode CTE1 may cover or overlap the first electrode AE and a part of the light emitting diode ED and may electrically connect the first electrode AE to the light emitting diode ED. The second contact electrode CTE2 may cover or overlap the second electrode CE and another part of the light emitting diode ED and may electrically connect the second electrode CE2 to the light emitting diode ED.

The contact electrode CTE may include a conductive material. For example, the contact electrode CTE may include ITO, IZO, ITZO, or aluminum (Al), but the material thereof is not limited thereto.

Figure 7:
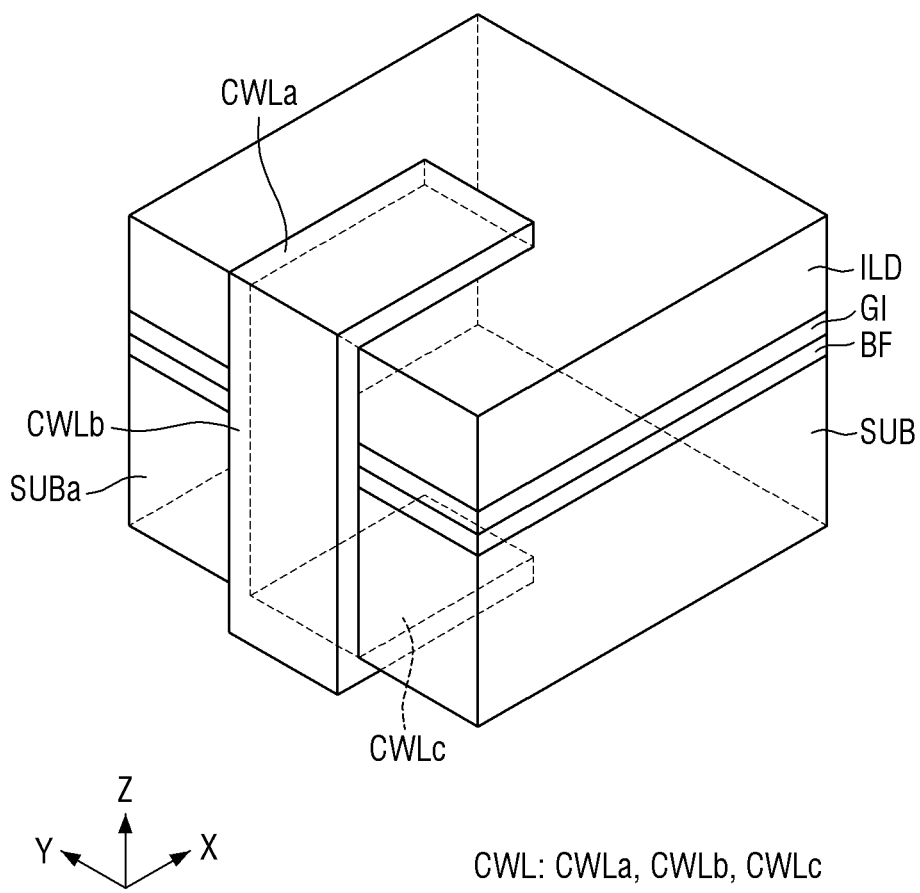
FIG. 7 is a view illustrating a connection line of a display device according to an embodiment.

FIG. 7 is a schematic view illustrating a connection line of a display device according to an embodiment.

Referring to FIG. 7, the connection line CWL may include a first portion CWLa, a second portion CWLb, and a third portion CWLc.

The first portion CWLa of the connection line CWL may be disposed in the non-display area NDA of the thin film transistor layer TFTL. The first portion CWLa of the connection line CWL may be electrically connected to data lines or scan lines. For example, the first portion CWLa of the connection line CWL may be disposed on the interlayer insulating film ILD and thus may be formed of the same or similar material as the first and second connection electrodes CNE1 and CNE2 of the thin film transistor layer TFTL in the same layer thereas. For another example, the first portion CWLa of the connection line CWL may be disposed on the gate insulating film GI and thus may be formed of the same or similar material as the gate electrode GE of the thin film transistor TFT in the same layer thereas.

The second portion CWLb of the connection line CWL may be disposed between the first portion CWLa and the third portion CWLc. The second portion CWLb of the connection line CWL may extend from the upper side surface of the interlayer insulating film ILD to the lower side surface SUBa of the substrate SUB, thereby electrically connecting the first portion CWLa of the connection line CWL, disposed on the thin film transistor layer TFTL, to the third portion CWLc of the connection line CWL disposed on the lower surface of the substrate SUB. Therefore, the second portion CWLb of the connection line CWL may be disposed on the side surface of the interlayer insulating film ILD, the side surface of the gate insulating film GI, the side surface of the buffer layer BF, and the side surface SUBa of the substrate SUB.

The third portion CWLc of the connection line CWL may be disposed on the lower surface of the substrate SUB to electrically connect the second portion CWLb of the connection line CWL to the pad unit PD. Therefore, an electrical signal supplied from the pad unit PD may sequentially pass through the third portion CWLc, the second portion CWLb, and the first portion CWLa of the connection line CWL and may be transmitted to the thin film transistor TFT.

Figure 8:
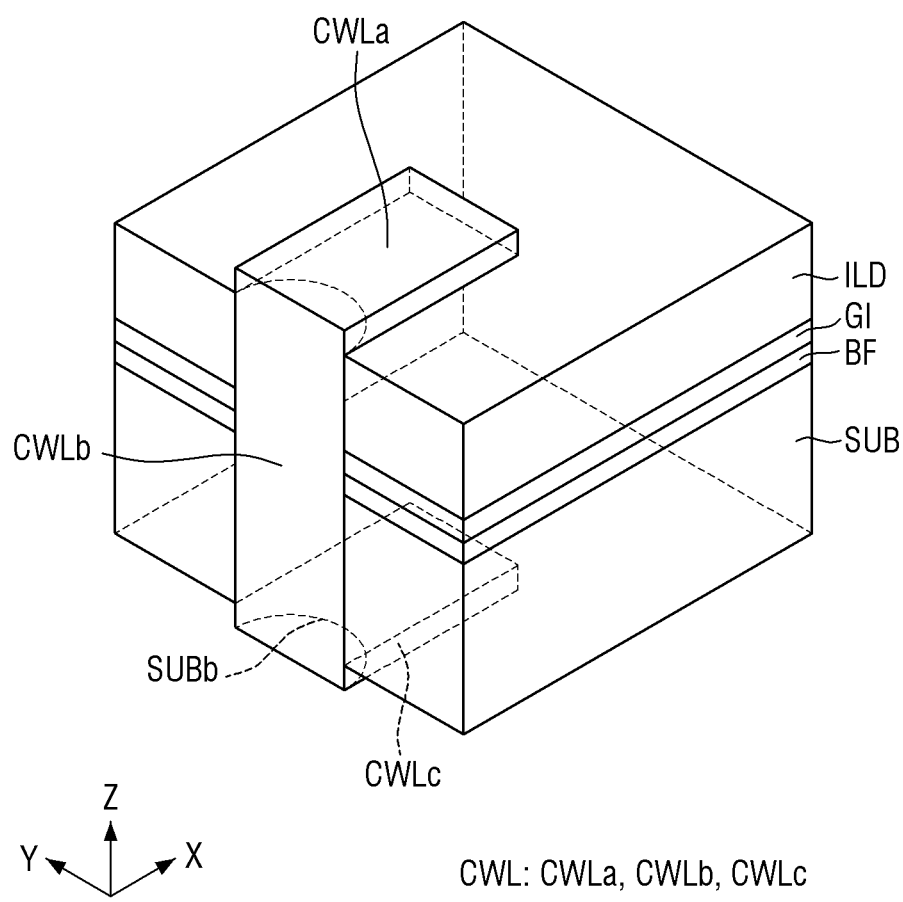
FIG. 8 is a view illustrating a connection line of a display device according to an embodiment.

FIG. 8 is a schematic view illustrating a connection line of a display device according to an embodiment.

Referring to FIG. 8, the display device 10 may include a recess SUBb disposed on a part of the side surface of the substrate SUB. The recess SUBb of the substrate SUB may be depressed or recessed from the side surface of the substrate SUB. The display device 10 may further include recesses disposed on parts of the side surfaces of the buffer layer BF, the gate insulating film GI, and the interlayer insulating film ILD, and the recesses of the buffer layer BF, the gate insulating film GI, and the interlayer insulating film ILD may be connected to the recess SUBb of the substrate SUB. The substantially planar shape of the recess SUBb may be a semi-circle, but is not limited thereto. For example, the number of recesses SUBb may correspond to that of connection lines CWL.

The connection line CWL may include a first portion CWLa, a second portion CWLb, and a third portion CWLc.

The first portion CWLa of the connection line CWL may be disposed in the non-display area NDA of the thin film transistor layer TFTL. The first portion CWLa of the connection line CWL may be electrically connected to data lines or scan lines. For example, the first portion CWLa of the connection line CWL may be disposed on the interlayer insulating film ILD and thus may be formed of the same or similar material as the first and second connection electrodes CNE1 and CNE2 of the thin film transistor layer TFTL in the same layer thereas. For another example, the first portion CWLa of the connection line CWL may be disposed on the gate insulating film GI and thus may be formed of the same or similar material as the gate electrode GE of the thin film transistor TFT in the same layer thereas.

The second portion CWLb of the connection line CWL may be accommodated in the recess SUBb of the substrate SUB. The second portion CWLb of the connection line CWL may be disposed between the first portion CWLa and the third portion CWLc. The second portion CWLb of the connection line CWL may extend from the recess of the interlayer insulating film ILD to the recess SUBb of the substrate SUB, thereby electrically connecting the first portion CWLa of the connection line CWL, disposed on the thin film transistor layer TFTL, to the third portion CWLc of the connection line CWL disposed on the lower surface of the substrate SUB. In a case that the second portion CWLb of the connection line CWL is accommodated in the recess SUBb, the area of the non-display area NDA may be reduced, compared to in a case that the display device 10 may include no recess.

The third portion CWLc of the connection line CWL may be disposed on the lower surface of the substrate SUB to electrically connect the second portion CWLb of the connection line CWL to the pad unit PD. Therefore, an electrical signal supplied from the pad unit PD may sequentially pass through the third portion CWLc, the second portion CWLb, and the first portion CWLa of the connection line CWL and may be transmitted to the thin film transistor TFT.

Figure 9:
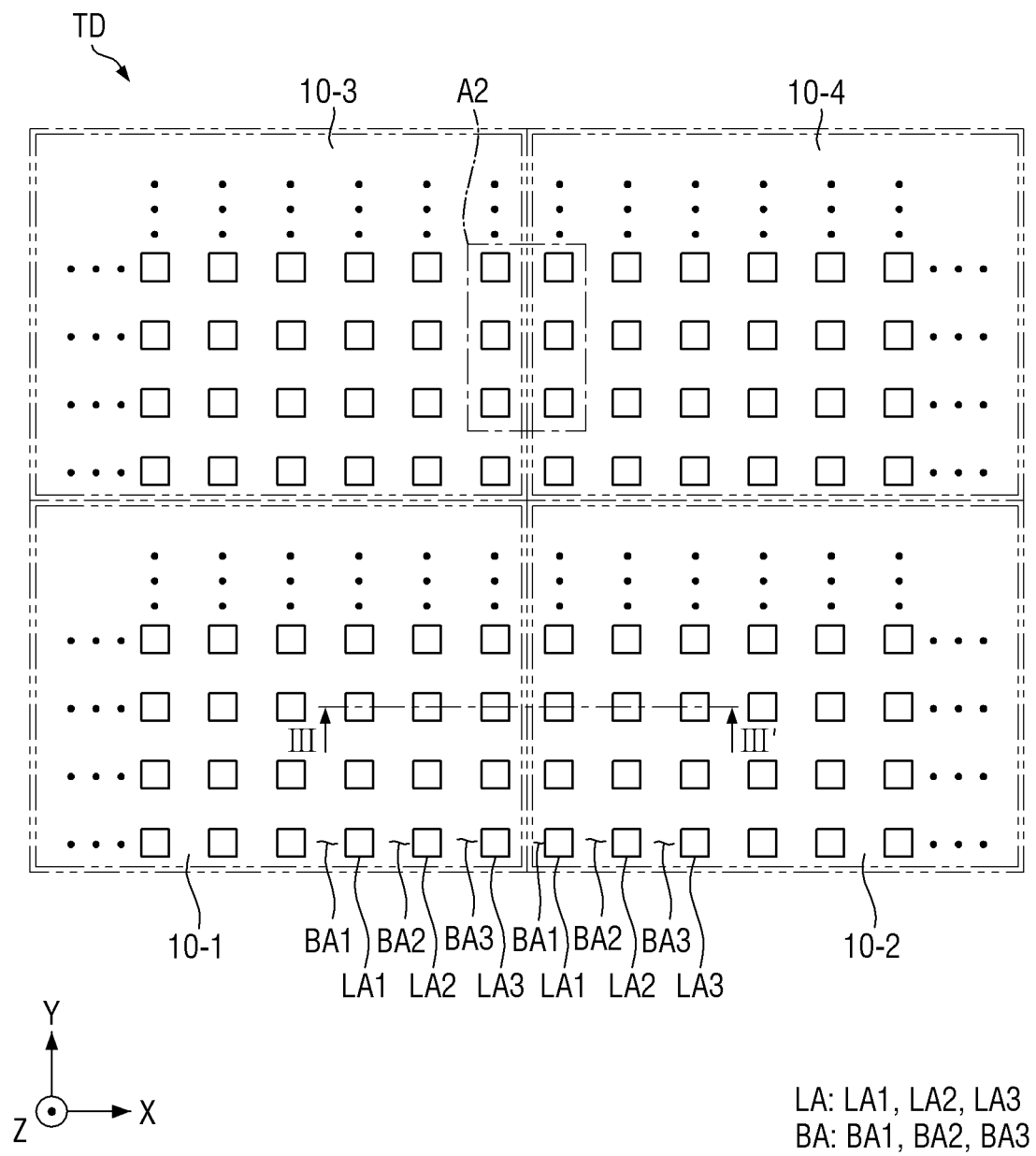
FIG. 9 is a plan view illustrating a coupling structure of a tiled display device according to an embodiment.
Figure 10:
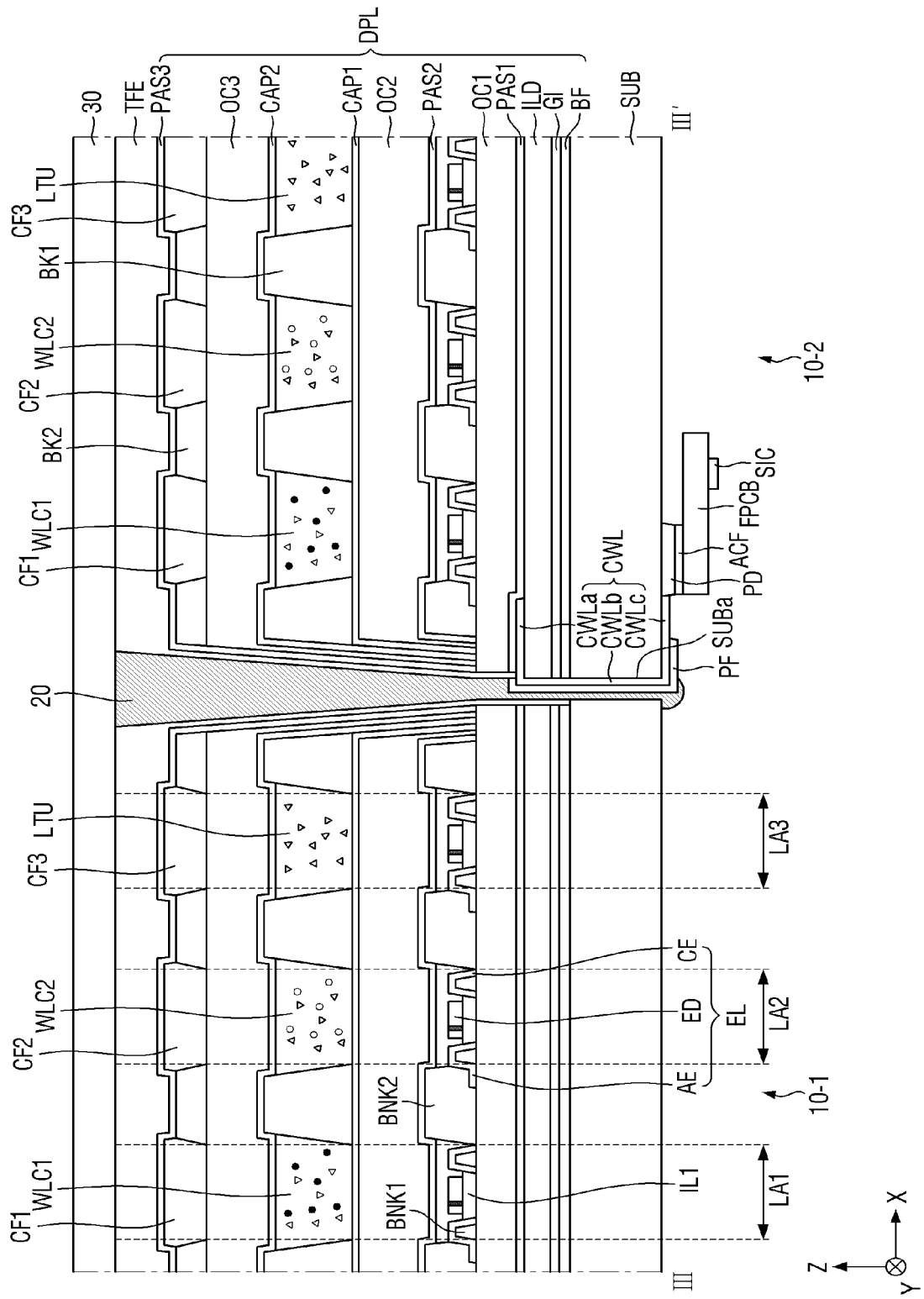
FIG. 10 is a schematic cross-sectional view taken along the line III-III' of FIG. 9.

FIG. 9 is a plan view illustrating a coupling structure of a tiled display device according to an embodiment, and FIG. 10 is a schematic cross-sectional view of a tiled display device according to an embodiment taken along line III-III' of FIG. 9. Hereinafter, the same configuration as the above-described configuration will be briefly described or omitted.

Referring to FIGS. 9 and 10, the tiled display device TD may include display devices 10, a coupling member 20, and a cover member 30. For example, the tiled display device TD may include first to fourth display devices 10-1, 10-2, 10-3, and 10-4, but the number of the display devices 10 is not limited to that of the embodiment of FIG. 9. The number of the display devices 10 may be determined depending on the size of each of the display device 10 and the tiled display device TD.

The display device 10 may include a substrate SUB, a display layer DPL, an encapsulation layer TFE, a connection line CWL, a protection member PF, a pad unit PD, a flexible film FPCB, and a source driver SIC.

The substrate SUB may be a base plate or a base member and may be made of an insulating material such as a polymer resin. For example, the substrate SUB may be a flexible substrate capable of bending, folding, rolling, or the like within the spirit and the scope of the disclosure. The substrate SUB may include polyimide PI, but the material thereof is not limited thereto.

The display layer DPL may be disposed on the substrate SUB. The display layer DPL may include a buffer layer BF, a thin film transistor layer TFTL, a light emitting element layer EML, a wavelength conversion layer WLCL, and a color filter layer CFL, which are illustrated in FIG. 3. Hereinafter, descriptions of the above-described components illustrated in FIG. 3 will be omitted.

The connection line CWL may electrically connect the thin film transistor TFT of the thin film transistor layer TFTL to the pad unit PD disposed on the lower surface of the substrate SUB. The connection line CWL may supply an electric signal, received from the pad unit PD, to the thin film transistor TFT. The connection line CWL may be electrically connected to data lines to supply a data voltage and may be electrically connected to scan lines to supply a scan signal. For example, the connection line CWL may be formed of the same or similar material as the first and second connection electrodes CNE1 and CNE2 of the thin film transistor layer TFTL in the same layer thereas, but the disclosure is not limited thereto. For another example, the connection line CWL may be formed of the same or similar material as the gate electrode GE of the thin film transistor TFT in the same layer thereas.

The connection line CWL may include a first portion CWLa, a second portion CWLb, and a third portion CWLc.

The first portion CWLa of the connection line CWL may be disposed in the non-display area NDA of the thin film transistor layer TFTL. The first portion CWLa of the connection line CWL may be electrically connected to data lines or scan lines. For example, the first portion CWLa of the connection line CWL may be disposed on the interlayer insulating film ILD and thus may be formed of the same or similar material as the first and second connection electrodes CNE1 and CNE2 of the thin film transistor layer TFTL in the same layer thereas. For another example, the first portion CWLa of the connection line CWL may be disposed on the gate insulating film GI and thus may be formed of the same or similar material as the gate electrode GE of the thin film transistor TFT in the same layer thereas.

The second portion CWLb of the connection line CWL may be disposed between the first portion CWLa and the third portion CWLc. The second portion CWLb of the connection line CWL may extend from the upper side surface of the interlayer insulating film ILD to the lower side surface SUBa of the substrate SUB, thereby electrically connecting the first portion CWLa of the connection line CWL, disposed on the thin film transistor layer TFTL, to the third portion CWLc of the connection line CWL disposed on the lower surface of the substrate SUB. Therefore, the second portion CWLb of the connection line CWL may be disposed on the side surface of the interlayer insulating film ILD, the side surface of the gate insulating film GI, the side surface of the buffer layer BF, and the side surface SUBa of the substrate SUB.

The third portion CWLc of the connection line CWL may be disposed on the lower surface of the substrate SUB to electrically connect the second portion CWLb of the connection line CWL to the pad unit PD. Therefore, an electrical signal supplied from the pad unit PD may sequentially pass through the third portion CWLc, the second portion CWLb, and the first portion CWLa of the connection line CWL and may be transmitted to the thin film transistor TFT.

The protection member PF may cover or overlap the side surface SUBa of the substrate SUB and the second portion CWLb of the connection line CWL. The protection member PF may protect the second portion CWLb of the connection line CWL exposed from the side surface SUBa of the substrate SUB. For example, the protection member PF may be disposed on the entire side surface SUBa of the substrate SUB to protect the connection lines CWL. As another example, the protection member PF may cover or overlap each of the connection lines CWL and protect the corresponding connection line CWL.

The pad unit PD may be disposed on the lower surface of the substrate SUB. The pad unit PD may receive various voltages or signals from the flexible film FPCB and may supply the corresponding voltages or signals to the thin film transistor TFT through the connection line CWL. Therefore, the display device 10 may not include an additional pad unit disposed at the outermost side thereof, and the non-display area NDA, bezel area, or dead space of the display device 10 may be minimized. Since the pad unit PD may be disposed on the lower surface of the display device 10 and electrically connected to the thin film transistor TFT through the connection line CWL, the interval between the display devices 10 may be further reduced, compared to in a case that the pad unit PD is disposed on the outermost side of the substrate SUB or in a case that the flexible film FPCB is disposed on the side surface of the substrate SUB.

The flexible film FPCB may be disposed on the lower surface of the substrate SUB. The flexible film FPCB may be attached to the pad unit PD through the adhesive film ACF. A side of the flexible film FPCB may be electrically connected to the pad unit PD, and the other side of the flexible film FPCB may be electrically connected to a source circuit board (not illustrated) on the lower surface of the substrate SUB. The flexible film FPCB may transmit a signal of the source driver SIC to the display device 10. For example, the source driver SIC may be an integrated circuit (IC). The source driver SIC may convert digital video data into an analog data voltage based on a source control signal of a timing controller and may supply the analog data voltage to the thin film transistor TFT of the display area DA through the flexible film FPCB.

The tiled display device TD may have the side surfaces of the adjacent display devices 10 that may be coupled or connected to each other by using the coupling member 20 disposed between the display devices 10. The coupling member 20 may implement the tiled display device TD by connecting, to each other, the side surfaces of the display devices 10-1 to 10-4 arranged or disposed in a grid shape. The coupling member 20 may couple or connect the side surfaces of the substrate SUB, the protection member PF, and the encapsulation layer TFE of each of the display devices 10 adjacent to each other.

For example, the coupling member 20 may be formed as an adhesive or double-sided tape having a relatively thin or reduced thickness, thereby minimizing the distance between the display devices 10. For another example, the coupling member 20 may be formed as a coupling frame having a relatively thin or reduced thickness, thereby minimizing the distance between the display devices 10. Therefore, the tiled display device TD may prevent a user from recognizing the non-display area NDA or boundary portion between the display devices 10.

The cover member 30 may be disposed on the upper surfaces of the display devices 10 and the coupling member 20 to cover or overlap the display devices 10 and the coupling member 20. For example, the cover member 30 may be disposed on the upper surface of the encapsulation layer TFE of each of the display devices 10. The cover member 30 may protect the upper surface of the tile type display device TD.

Figure 11:
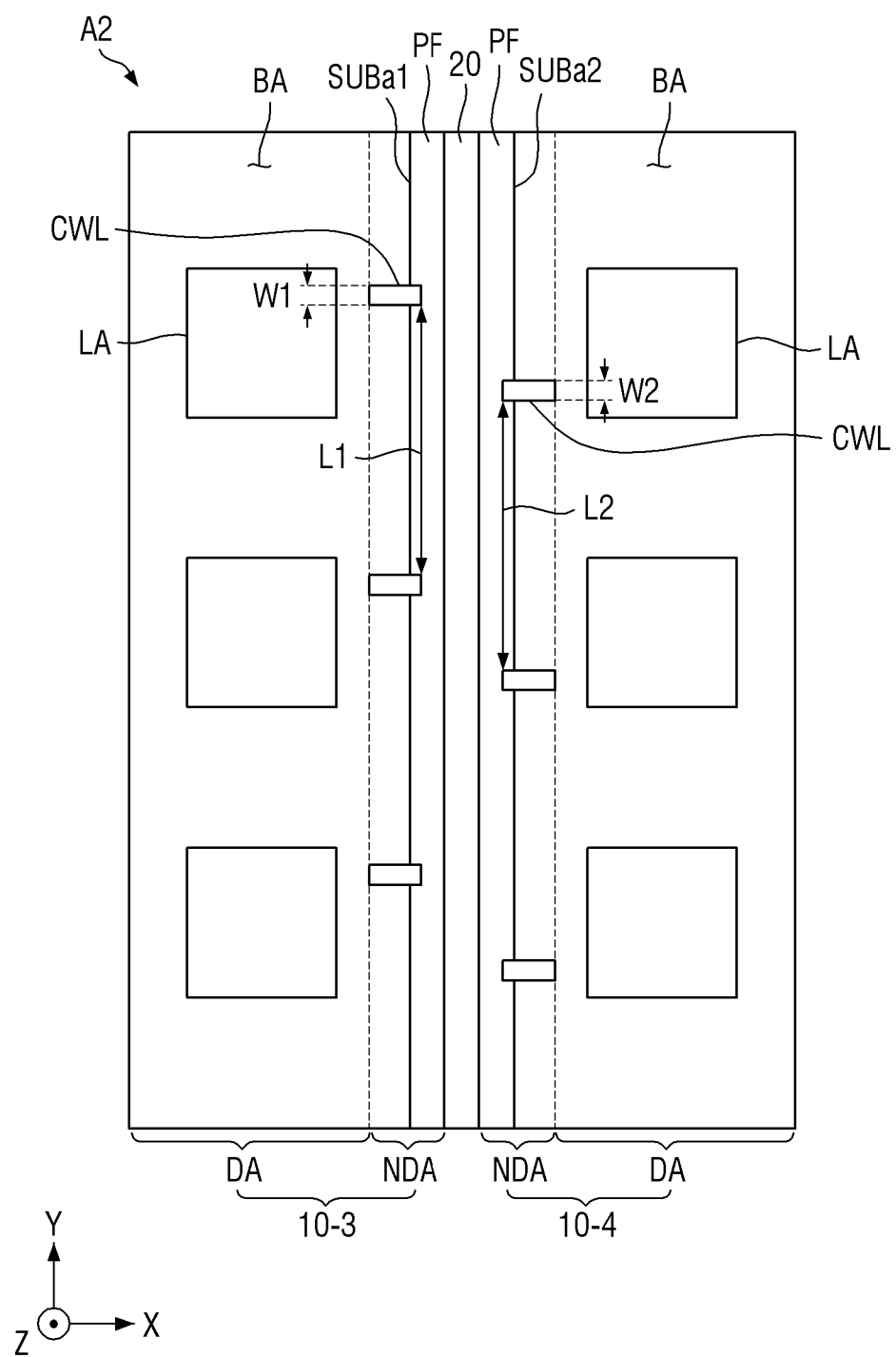
FIG. 11 is an enlarged view of area A2 of FIG. 9.

FIG. 11 is a schematic enlarged view of area A2 of FIG. 9.

Referring to FIG. 11, the third display device 10-3 and the fourth display device 10-4 may be coupled or connected to each other through the coupling member 20. Each of the third and fourth display devices 10-3 and 10-4 may include light emitting areas LA, light blocking areas BA, a connection line CWL, and a protection member PF.

Pixels may be arranged or disposed in rows and columns in the display area DA of each of the third and fourth display devices 10-3 and 10-4. Each of the pixels may include a light emitting area LA defined by a pixel defining layer or a bank and may emit light having a predetermined peak wavelength through the light emitting area LA. For example, the display area DA of each of the third and fourth display devices 10-3 and 10-4 may include first to third light emitting areas LA1, LA2, and LA3. Each of the first to third light emitting areas LA1, LA2, and LA3 may be an area in which light generated by the light emitting element EL is emitted outside of the display device 10.

The light blocking areas BA may be disposed in the display area DA to surround the light emitting areas LA. For example, the display area DA may include first to third light blocking areas BA1, BA2, and BA3. Each of the first to third light blocking areas BA1, BA2, and BA3 may be disposed at one or a side of each of the first to third light emitting areas LA1, LA2, and LA3 and may prevent the mixing of colors of light emitted from the first to third light emitting areas LA1, LA2, and LA3.

The connection line CWL may be disposed in the non-display area NDA to electrically connect the thin film transistor TFT of each of the pixels, disposed in the display area DA, to the pad unit PD disposed on the lower surface of the substrate SUB. The connection line CWL may be disposed in the non-display area NDA of the substrate SUB, the side surface SUBa of the substrate SUB, and the lower surface of the substrate SUB to be electrically connected to the pad unit PD. The connection line CWL may supply an electric signal, received from the pad unit PD, to the thin film transistor TFT. The connection line CWL may be electrically connected to data lines to supply a data voltage and may be electrically connected to scan lines to supply a scan signal. For example, the connection line CWL may be formed of the same or similar material as the first and second connection electrodes CNE1 and CNE2 of the thin film transistor layer TFTL in the same layer thereas, but the disclosure is not limited thereto. For another example, the connection line CWL may be formed of the same or similar material as the gate electrode GE of the thin film transistor TFT in the same layer thereas.

The third display device 10-3 may include connection lines CWL disposed on a side surface SUBa1, and the fourth display device 10-4 may include connection lines CWL disposed on a side surface SUBa2 facing the side surface SUBa1 of the third display device 10-3. The connection lines CWL of the third display device 10-3 and the connection lines CWL of the fourth display device 10-4 may be arranged or disposed to be staggered or offset or may alternate with each other. The connection lines CWL of the third display device 10-3 and the connection lines CWL of the fourth display device 10-4 may be arranged or disposed in different rows. Here, the row may correspond to a line in the first direction (X-axis direction). For example, each of the connection lines CWL of the third display device 10-3 may be disposed in an odd row, and each of the connection lines CWL of the fourth display device 10-4 may be disposed in an even row, but the disclosure is not limited thereto.

Each of the connection lines CWL of the third display device 10-3 may correspond to an area between the connection lines CWL of the fourth display device 10-4. Each of the connection lines CWL of the third display device 10-3 may face the side surface SUBa2 of the fourth display device 10-4.

Each of the connection lines CWL of the fourth display device 10-4 may correspond to an area between the connection lines CWL of the third display device 10-3. Each of the connection lines CWL of the fourth display device 10-4 may face the side surface SUBa1 of the third display device 10-3.

The width W1 of each of the connection lines CWL of the third display device 10-3 may be smaller than the distance L2 between the connection lines CWL of the fourth display device 10-4. The width W2 of each of the connection lines CWL of the fourth display device 10-4 may be smaller than the distance L1 between the connection lines CWL of the third display device 10-3. For example, the width W1 of each of the connection lines CWL of the third display device 10-3 may be the same as the width W2 of each of the connection lines CWL of the fourth display device 10-4, but the disclosure is not limited thereto. The distance L1 between the connection lines CWL of the third display device 10-3 may be the same as the distance L2 between the connection lines CWL of the fourth display device 10-4, but the disclosure is not limited thereto.

The protection member PF may cover or overlap each of the side surfaces SUB1a and SUB1b of the third and fourth display devices 10-3 and 10-4 and each of the connection lines CWL of the third and fourth display devices 10-3 and 10-4. For example, the protection member PF may be disposed on the entire side surfaces SUB1a and SUB1b of each of the third and fourth display devices 10-3 and 10-4, thereby protecting the connection lines CWL. For another example, the protection member PF may cover or overlap each of the connection lines CWL and protect the corresponding connection lines CWL.

The tiled display device TD may have the side surfaces of the adjacent display devices 10 that may be coupled or connected to each other by using the coupling member 20 disposed between the display devices 10. For example, the coupling member 20 may be disposed between the protection members PF of the adjacent display devices 10.

The protection member PF may be selectively omitted, and the coupling member 20 may protect the connection lines CWL while coupling side surfaces of the display devices 10.

As described above, in the tiled display device TD, the connection lines CWL of the display devices 10, adjacent to each other, may be arranged or disposed to be staggered or offset or may alternate with each other, thereby minimizing electrical interference between the connection lines CWL. For example, the tiled display device TD may prevent the generation of capacitance between the connection lines CWL of the third display device 10-3 and those of the fourth display device 10-4. The tiled display device TD may prevent an electrical short between the connection lines CWL of the third display device 10-3 and those of the fourth display device 10-4. As a result, since the tiled display device TD may include connection lines CWL that may be arranged or disposed to be staggered or offset or may alternate with each other, the interval between the display devices 10 may be minimized, thereby preventing the user from recognizing the non-display area NDA or the boundary portion between the display devices 10, and minimizing the electrical interference between the connection lines CWL.

Figure 12:
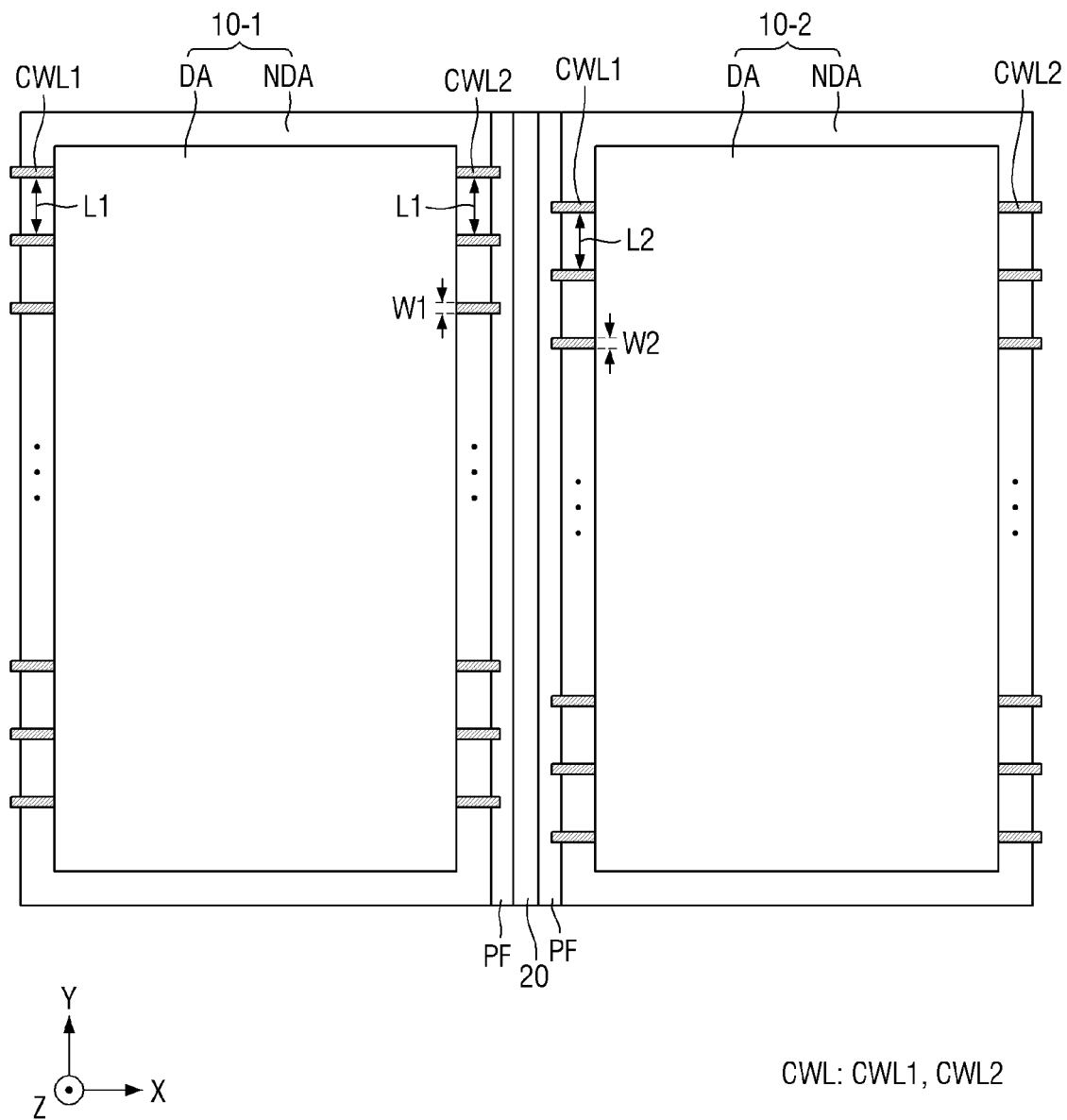
FIG. 12 is a plan view illustrating first and second display devices according to an embodiment.

FIG. 12 is a plan view illustrating first and second display devices according to an embodiment.

Referring to FIG. 12, the first display device 10-1 and the second display device 10-2 may be coupled or connected to each other through the coupling member 20. Each of the first display device 10-1 and the second display device 10-2 may include a display area DA, a non-display area NDA, connection lines CWL arranged or disposed in the non-display area NDA, and a protection member PF.

The first display device 10-1 may include first connection lines CWL1 arranged or disposed at a side surface and second connection lines CWL2 arranged or disposed at the other side surface opposite to the side surface. The first connection lines CWL1 and the second connection lines CWL2 of the first display device 10-1 may be arranged or disposed symmetrically with respect to the display area DA. Therefore, the first connection line CWL1 and the second connection lines CWL2 of the first display device 10-1 may be arranged or disposed in the same row. Here, the row may correspond to a line in the first direction (X-axis direction).

The second display device 10-2 may include first connection lines CWL1 arranged or disposed at a side surface and second connection lines CWL2 arranged or disposed at the other side surface opposite to the side surface. The first connection lines CWL1 and the second connection lines CWL2 of the second display device 10-2 may be arranged or disposed symmetrically with respect to the display area DA. Therefore, the first connection lines CWL1 and the second connection lines CWL2 of the second display device 10-2 may be arranged or disposed in the same row.

The other side surface of the first display device 10-1 may face a side surface of the second display device 10-2. The second connection lines CWL2 of the first display device 10-1 and the first connection lines CWL1 of the second display device 10-2 may be arranged or disposed to be staggered or offset or may alternate with each other. The second connection lines CWL2 of the first display device 10-1 and the first connection lines CWL1 of the second display device 10-2 may be arranged or disposed in different rows. For example, the second connection lines CWL2 of the first display device 10-1 may be arranged or disposed in an odd row, and the first connection lines CWL1 of the second display device 10-2 may be arranged or disposed in an even row.

Each of the second connection lines CWL2 of the first display device 10-1 may correspond to an area between the first connection lines CWL1 of the second display device 10-2. Each of the second connection lines CWL2 of the first display device 10-1 may face a side surface of the second display device 10-2.

Each of the first connection lines CWL1 of the second display device 10-2 may correspond to an area between the second connection lines CWL2 of the first display device 10-1. Each of the first connection lines CWL1 of the second display device 10-2 may face the other side surface of the first display device 10-1.

The width W1 of each of the second connection line CWL2 of the first display device 10-1 may be smaller than the distance L2 between the first connection lines CWL1 of the second display device 10-2. The width W2 of each of the first connection lines CWL1 of the second display device 10-2 may be smaller than the distance L1 between the second connection lines CWL2 of the first display device 10-1. For example, the width W1 of each of the second connection lines CWL2 of the first display device 10-1 may be the same as the width W2 of each of the first connection lines CWL1 of the second display device 10-2, but the disclosure is not limited thereto. The distance L1 between the second connection lines CWL2 of the first display device 10-1 may be the same as the distance L2 between the first connection lines CWL1 of the second display device 10-2, but the disclosure is not limited thereto.

In the tiled display device TD, the second connection lines CWL2 of the first display device 10-1 and the first connection lines CWL1 of the second display device 10-2 may be arranged or disposed to be staggered or offset or may alternate with each other, thereby minimizing electrical interference between the connection lines CWL. For example, the tiled display device TD may prevent the generation of capacitance between the second connection lines CWL2 of the first display device 10-1 and the first connection lines CWL1 of the second display device 10-2. The tiled display device TD may prevent an electrical short between the second connection lines CWL2 of the first display device 10-1 and the first connection lines CWL1 of the second display device 10-2.

Figure 13:
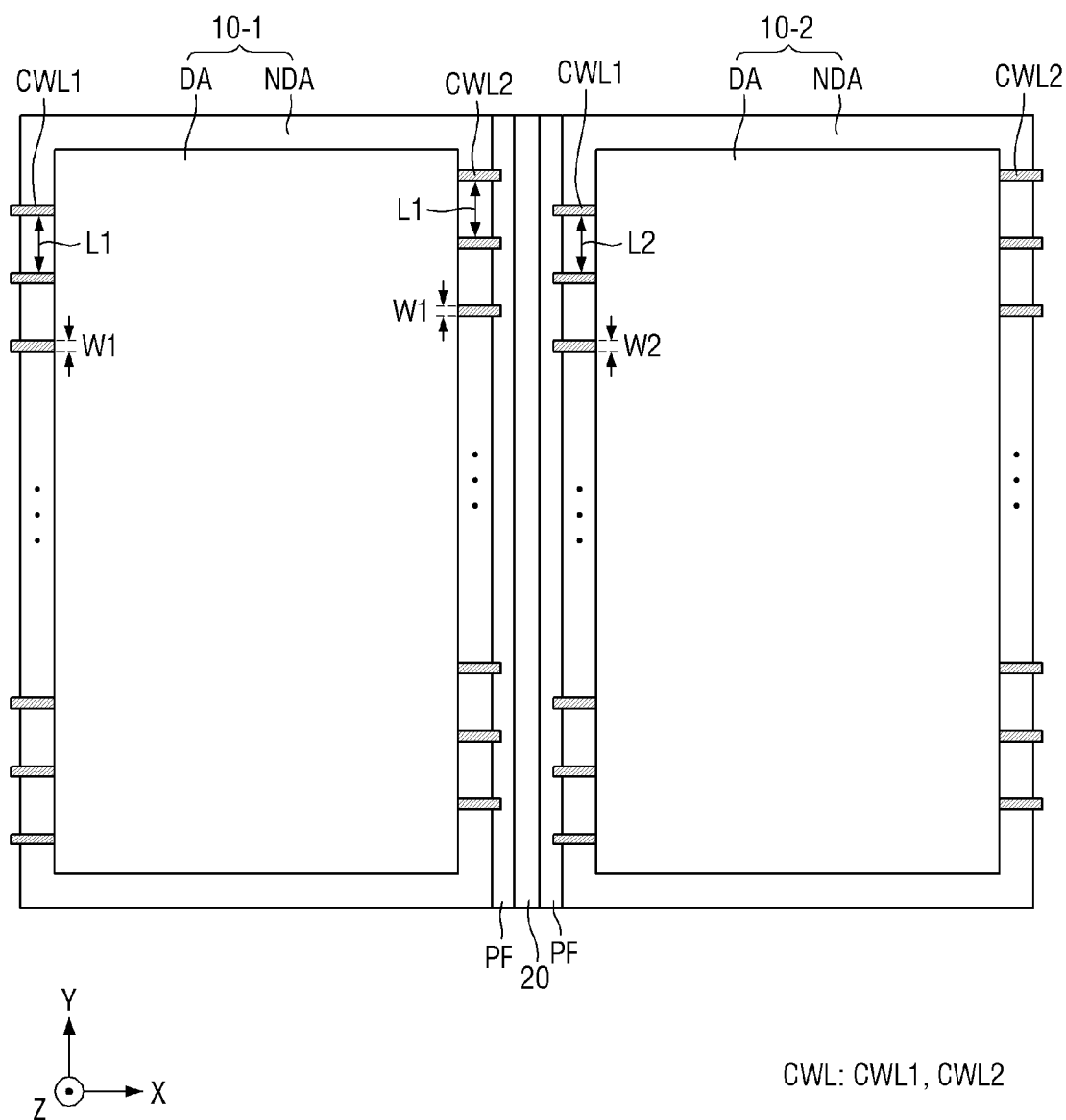
FIG. 13 is a plan view illustrating first and second display devices according to an embodiment.

FIG. 13 is a plan view illustrating first and second display devices according to an embodiment.

Referring to FIG. 13, the first display device 10-1 and the second display device 10-2 may be coupled or connected to each other through the coupling member 20. Each of the first display device 10-1 and the second display device 10-2 may include a display area DA, a non-display area NDA, connection lines CWL arranged or disposed in the non-display area NDA, and a protection member PF.

The first display device 10-1 may include first connection lines CWL1 arranged or disposed at a side surface and second connection lines CWL2 arranged or disposed at the other side surface opposite to the side surface. The first connection lines CWL1 and the second connection lines CWL2 of the first display device 10-1 may be arranged or disposed to be staggered or offset or may alternate with each other with respect to the display area DA. Therefore, the first connection lines CWL1 and the second connection lines CWL2 of the first display device 10-1 may be arranged or disposed in different rows. Here, the row may correspond to a line in the first direction (X-axis direction). For example, the first connection lines CWL1 of the first display device 10-1 may be arranged or disposed in an even row, and the second connection lines CWL2 thereof may be arranged or disposed in an odd row.

The second display device 10-2 may include first connection lines CWL1 arranged or disposed at a side surface and second connection lines CWL2 arranged or disposed at the other or another side surface opposite to the side surface. The first connection lines CWL1 and the second connection lines CWL2 of the second display device 10-2 may be arranged or disposed to be staggered or offset or may alternate with each other with respect to the display area DA. Therefore, the first connection lines CWL1 and the second connection lines CWL2 of the second display device 10-2 may be arranged or disposed in different rows. For example, the first connection lines CWL1 of the second display device 10-2 may be arranged or disposed in an even row, and the second connection lines CWL2 thereof may be arranged or disposed in an odd row.

The other side surface of the first display device 10-1 may face a side surface of the second display device 10-2. The second connection lines CWL2 of the first display device 10-1 and the first connection lines CWL1 of the second display device 10-2 may be arranged or disposed to be staggered or offset or may alternate with each other. The second connection lines CWL2 of the first display device 10-1 and the first connection lines CWL1 of the second display device 10-2 may be arranged or disposed in different rows. For example, the second connection lines CWL2 of the first display device 10-1 may be arranged or disposed in an odd row, and the first connection lines CWL1 of the second display device 10-2 may be arranged or disposed in an even row.

Each of the second connection lines CWL2 of the first display device 10-1 may correspond to an area between the first connection lines CWL1 of the second display device 10-2. Each of the second connection lines CWL2 of the first display device 10-1 may face a side surface of the second display device 10-2.

Each of the first connection lines CWL1 of the second display device 10-2 may correspond to an area between the second connection lines CWL2 of the first display device 10-1. Each of the first connection lines CWL1 of the second display device 10-2 may face the other side surface of the first display device 10-1.

The width W1 of each of the second connection lines CWL2 of the first display device 10-1 may be smaller than the distance L2 between the first connection lines CWL1 of the second display device 10-2. The width W2 of each of the first connection lines CWL1 of the second display device 10-2 may be smaller than the distance L1 between the second connection lines CWL2 of the first display device 10-1. For example, the width W1 of each of the second connection line CWL2 of the first display device 10-1 may be the same as the width W2 of each of the first connection lines CWL1 of the second display device 10-2, but the disclosure is not limited thereto. The distance L1 between the second connection lines CWL2 of the first display device 10-1 may be the same as the distance L2 between the first connection lines CWL1 of the second display device 10-2, but the disclosure is not limited thereto.

In the tiled display device TD, the second connection lines CWL2 of the first display device 10-1 and the first connection lines CWL1 of the second display device 10-2 may be arranged or disposed to be staggered or offset or may alternate with each other, thereby minimizing electrical interference between the connection lines CWL. For example, the tiled display device TD may prevent the generation of capacitance between the second connection lines CWL2 of the first display device 10-1 and the first connection lines CWL1 of the second display device 10-2. The tiled display device TD may prevent an electrical short between the second connection lines CWL2 of the first display device 10-1 and the first connection lines CWL1 of the second display device 10-2.

Figure 14:
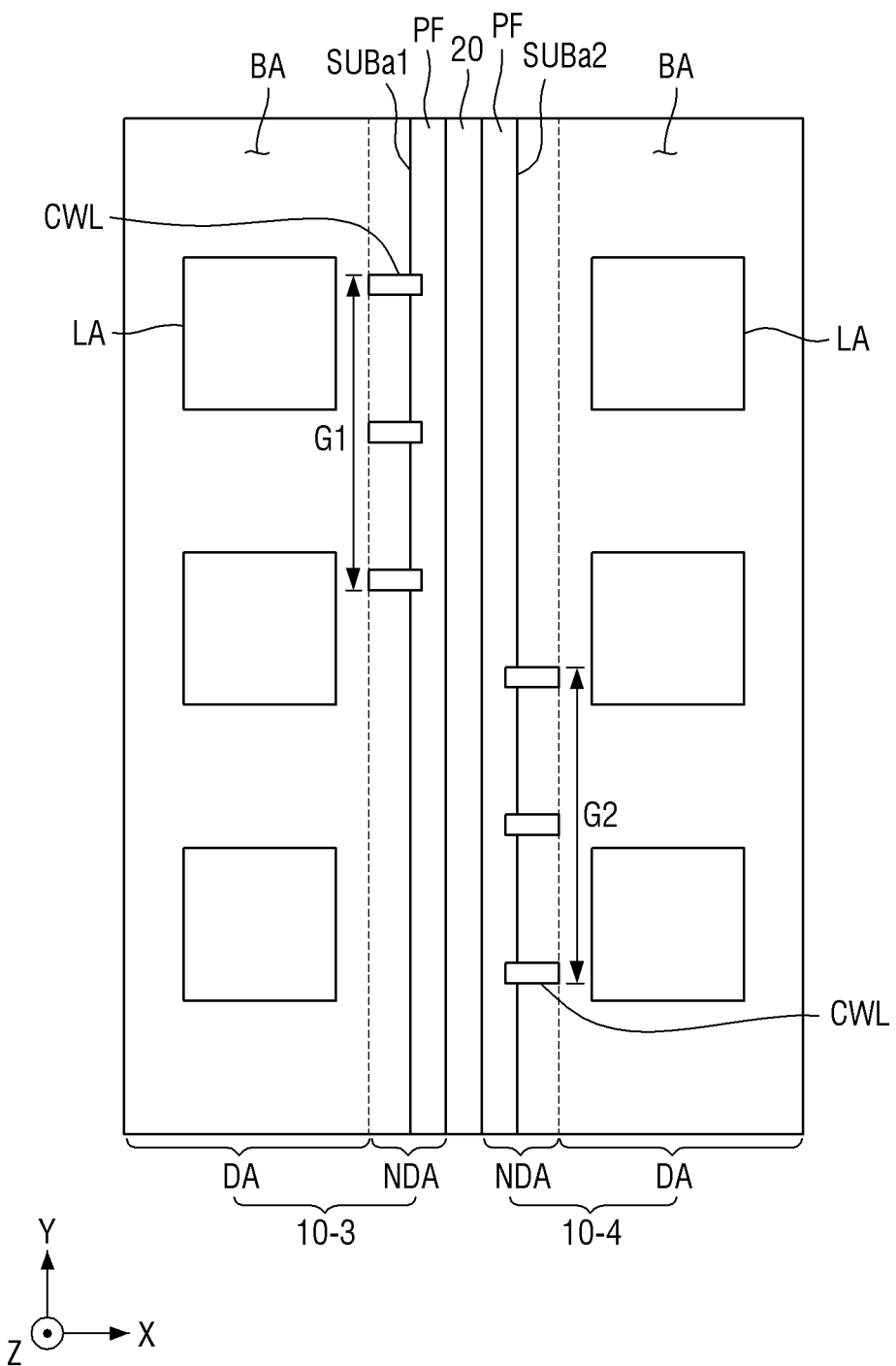
FIG. 14 is another enlarged view of area A2 of FIG. 9.

FIG. 14 is another schematic enlarged view of area A2 of FIG. 9.

Referring to FIG. 14, the third display device 10-3 and the fourth display device 10-4 may be coupled or connected to each other through the coupling member 20. Each of the third and fourth display devices 10-3 and 10-4 may include light emitting areas LA, light blocking areas BA, a connection line CWL, and a protection member PF.

Pixels may be arranged or disposed in rows and columns in the display area DA of each of the third and fourth display devices 10-3 and 10-4. Each of the pixels may include a light emitting area LA defined by a pixel defining layer or a bank and may emit light having a predetermined peak wavelength through the light emitting area LA.

Each of the third and fourth display devices 10-3 and 10-4 may include a line group consisting of connection lines CWL. For example, a line group may include three connection lines CWL, but the number of connection lines CWL per line group is not limited to that of FIG. 14. In a case that the line group of each of the third and fourth display devices 10-3 and 10-4 may include three connection lines CWL, a line group may correspond to the light emitting areas LA arranged or disposed in three rows, but the disclosure is not limited thereto. The width G1 of the line group of the third display device 10-3 and the width G2 of the line group of the fourth display device 10-4 may be smaller than the widths of the light emitting areas arranged or disposed in the three rows.

The other side surface of the third display device 10-3 may face a side surface of the fourth display device 10-4. The line group of the third display device 10-3 and the line group of the fourth display device 10-4 may be disposed to be staggered or offset or may alternate with each other. The line groups of the third display device 10-3 and the line groups of the fourth display device 10-4 may be arranged or disposed in different rows. For example, the line groups of the third display device 10-3 may be arranged or disposed in an odd row, and the line groups of the fourth display device 10-4 may be arranged or disposed in an even row.

In the tiled display device TD, the line groups of the third display device 10-3 and the line groups of the fourth display device 10-4 may be arranged or disposed to be staggered or offset or may alternate with each other, thereby minimizing electrical interference between the connection lines CWL. For example, the tiled display device TD may prevent the generation of capacitance between the line groups of the third display device 10-3 and the line groups of the fourth display device 10-4. The tiled display device TD may prevent an electrical short between the line groups of the third display device 10-3 and the line groups of the fourth display device 10-4.

Figure 15:
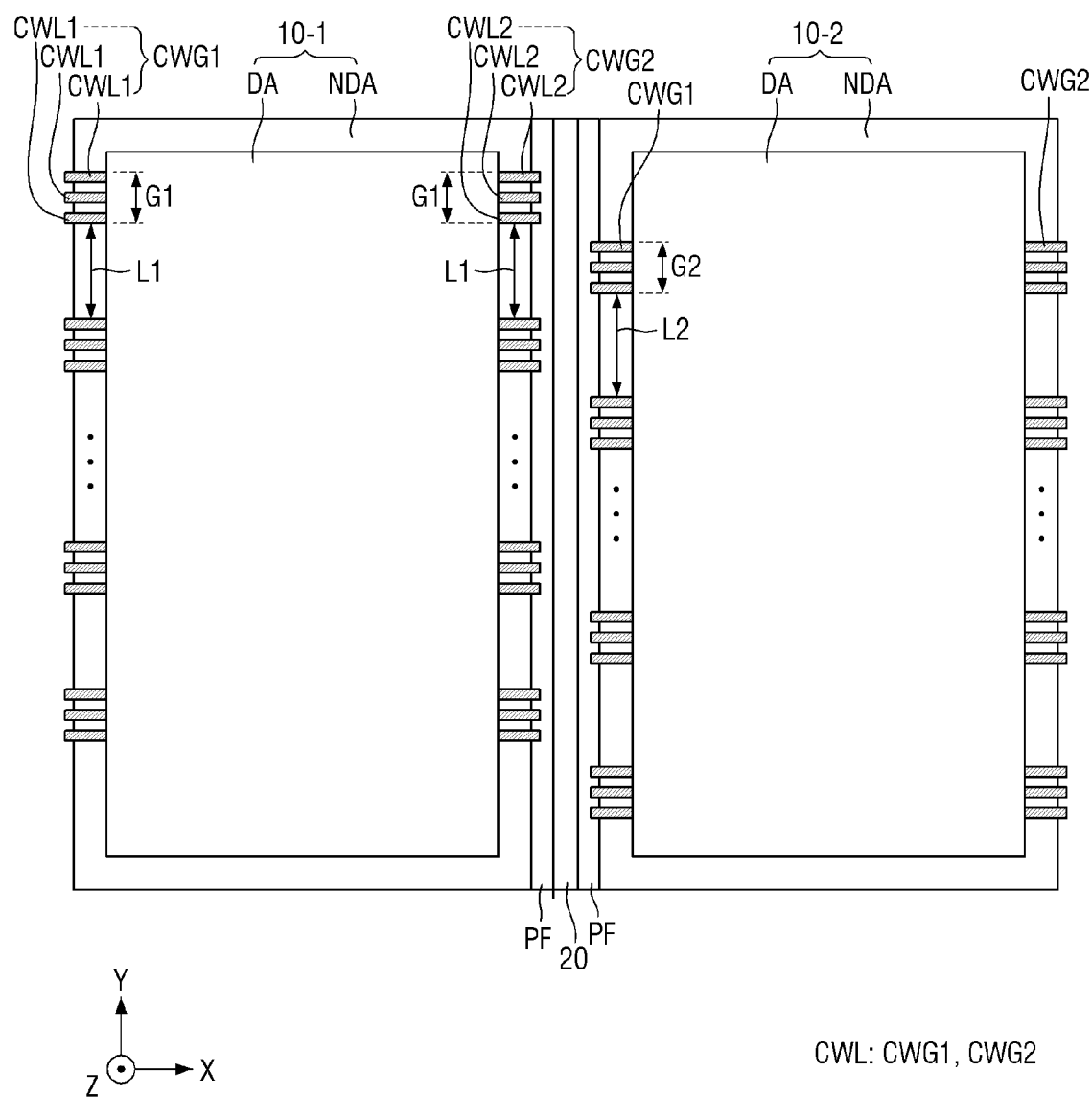
FIG. 15 is a plan view illustrating first and second display devices according to an embodiment.

FIG. 15 is a plan view illustrating first and second display devices according to an embodiment.

Referring to FIG. 15, the first display device 10-1 and the second display device 10-2 may be coupled or connected to each other through the coupling member 20. Each of the first and second display devices 10-1 and 10-2 may include a display area DA, a non-display area NDA, connection lines CWL arranged or disposed in the non-display area NDA, and a protection member PF.

The first display device 10-1 may include first line groups CWG1 arranged or disposed at a side surface and second line groups CWG2 arranged or disposed at the other side surface opposite to the side surface. The first line groups CWG1 may include first connection lines CWL1, and the second line groups CWG2 may include second connection lines CWL2. For example, a first line group CWG1 may include three first connection lines CWL1, but the number of connection lines CWL per line group is not limited to that of FIG. 15.

The first line groups CWG1 and the second line groups CWG2 of the first display device 10-1 may be arranged or disposed symmetrically with respect to the display area DA. Therefore, the first line groups CWG1 and the second line groups CWG2 of the first display device 10-1 may be arranged or disposed in the same row. Here, the row may correspond to a line in the first direction (X-axis direction).

The second display device 10-2 may include first line groups CWG1 arranged or disposed at a side surface and second line groups CWG2 arranged or disposed at the other side surface opposite to the side surface. The first line groups CWG1 and the second line groups CWG2 of the second display device 10-2 may be arranged or disposed symmetrically with respect to the display area DA. Therefore, the first line groups CWG1 and the second line groups CWG2 of the second display device 10-2 may be arranged or disposed in the same row.

The other side surface of the first display device 10-1 may face a side surface of the second display device 10-2. The second line groups CWG2 of the first display device 10-1 and the first line groups CWG1 of the second display device 10-2 may be arranged or disposed to be staggered or offset or may alternate with each other. The second line groups CWG2 of the first display device 10-1 and the first line groups CWG1 of the second display device 10-2 may be arranged or disposed in different rows. For example, the second line groups CWG2 of the first display device 10-1 may be arranged or disposed in an odd row, and the first line groups CWG1 of the second display device 10-2 may be arranged or disposed in an even row.

Each of the second line groups CWG2 of the first display device 10-1 may correspond to an area between the first line groups CWG1 of the second display device 10-2. Each of the second line groups CWG2 of the first display device 10-1 may face a side surface of the second display device 10-2.

Each of the first line groups CWG1 of the second display device 10-2 may correspond to an area between the second line groups CWG2 of the first display device 10-1. Each of the first line groups CWG1 of the second display device 10-2 may face the other side surface of the first display device 10-1.

The width G1 of each of the second line groups CWG2 of the first display device 10-1 may be smaller than the distance L2 between the first line groups CWG1 of the second display device 10-2. The width G2 of each of the first line groups CWG1 of the second display device 10-2 may be smaller than the distance L1 between the second line groups CWG2 of the first display device 10-1. For example, the width G1 of each of the second line groups CWG2 of the first display device 10-1 may be the same as the width G2 of each of the first line groups CWG1 of the second display device 10-2, but the disclosure is not limited thereto. The distance L1 between the second line groups CWG2 of the first display device 10-1 may be the same as the distance L2 between the first line groups CWG1 of the second display device 10-2, but the disclosure is not limited thereto.

In the tiled display device TD, the second line groups CWG2 of the first display device 10-1 and the first line groups CWG1 of the second display device 10-2 may be arranged or disposed to be staggered or offset or may alternate with each other, thereby minimizing electrical interference between the connection lines CWL. For example, the tiled display device TD may prevent the generation of capacitance between the second line groups CWG2 of the first display device 10-1 and the first line groups CWG1 of the second display device 10-2. The tiled display device TD may prevent an electrical short between the second line groups CWG2 of the first display device 10-1 and the first line groups CWG1 of the second display device 10-2.

Figure 16:
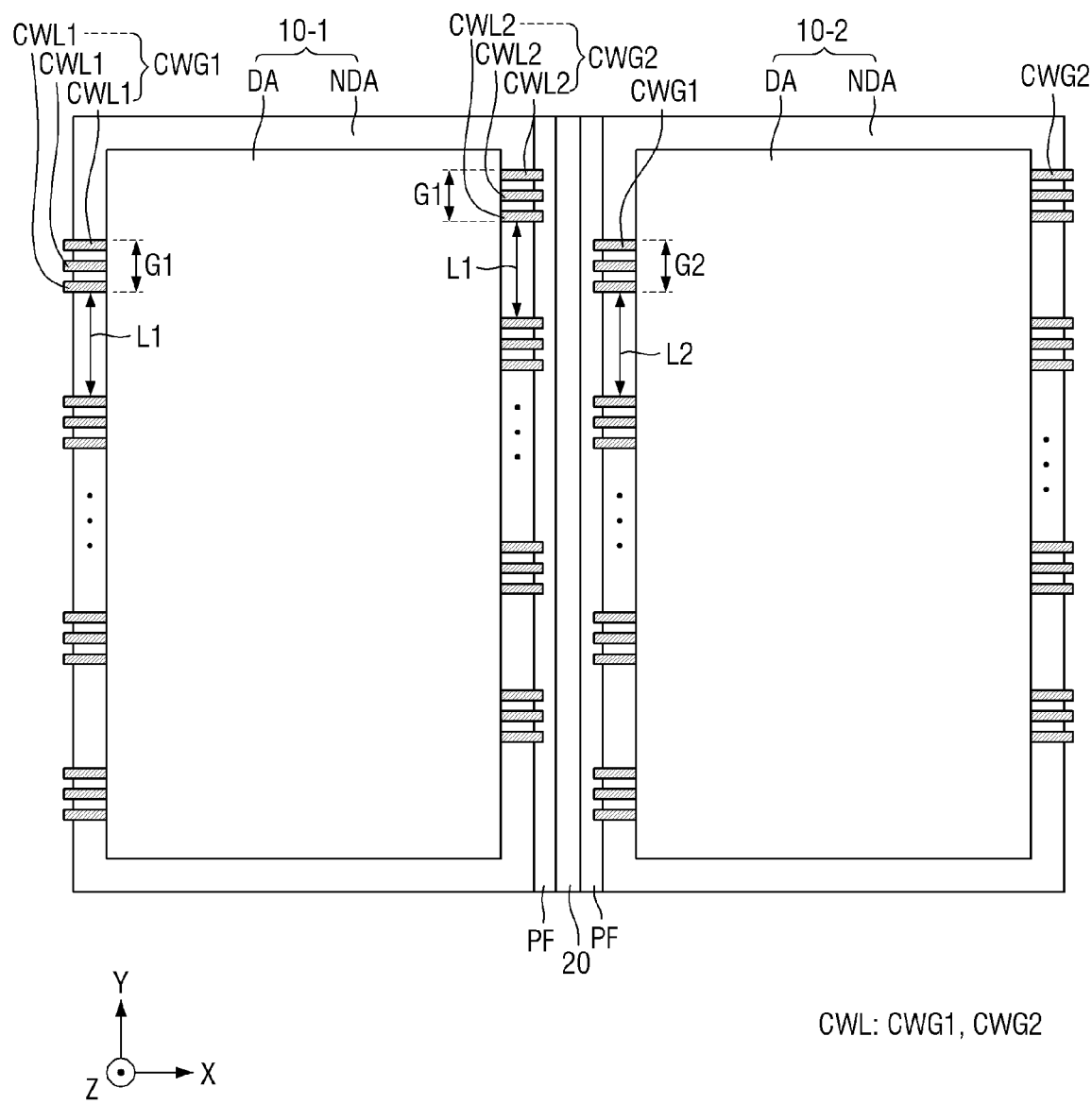
FIG. 16 is a plan view illustrating first and second display devices according to an embodiment.

FIG. 16 is a plan view illustrating first and second display devices according to an embodiment.

Referring to FIG. 16, the first display device 10-1 and the second display device 10-2 may be coupled or connected to each other through the coupling member 20. Each of the first and second display devices 10-1 and 10-2 may include a display area DA, a non-display area NDA, connection lines CWL arranged or disposed in the non-display area NDA, and a protection member PF.

The first display device 10-1 may include first line groups CWG1 arranged or disposed at a side surface and second line groups CWG2 arranged or disposed at the other side surface opposite to the side surface. The first line groups CWG1 may include first connection lines CWL1, and the second line groups CWG2 may include second connection lines CWL2. For example, a first line group CWG1 may include three first connection lines CWL1, but the number of connection lines CWL per line group is not limited to that of FIG. 16.

The first line groups CWG1 and the second line groups CWG2 of the first display device 10-1 may be arranged or disposed to be staggered or offset or may alternate with each other with respect to the display area DA. Therefore, the first line groups CWG1 and the second line groups CWG2 of the first display device 10-1 may be arranged or disposed in different rows. Here, the row may correspond to a line in the first direction (X-axis direction). For example, the first line groups CWG1 of the first display device 10-1 may be arranged or disposed in an even row, and the second line groups CWG2 thereof may be arranged or disposed in an odd row.

The second display device 10-2 may include first line groups CWG1 arranged or disposed at a side surface and second line groups CWG2 arranged or disposed at the other side surface opposite to the side surface. The first line groups CWG1 and the second line groups CWG2 of the second display device 10-2 may be arranged or disposed to be staggered or offset or may alternate with each other with respect to the display area DA. Therefore, the first line groups CWG1 and the second line groups CWG2 of the second display device 10-2 may be arranged or disposed in different row. For example, the first line groups CWG1 of the second display device 10-2 may be arranged or disposed in an even row, and the second line groups CWG2 thereof may be arranged or disposed in an odd row.

The other side surface of the first display device 10-1 may face a side surface of the second display device 10-2. The second line groups CWG2 of the first display device 10-1 and the first line groups CWG1 of the second display device 10-2 may be arranged or disposed to be staggered or offset or may alternate with each other. The second line groups CWG2 of the first display device 10-1 and the first line groups CWG1 of the second display device 10-2 may be arranged or disposed in different rows. For example, the second line groups CWG2 of the first display device 10-1 may be arranged or disposed in an odd row, and the first line groups CWG1 of the second display device 10-2 may be arranged or disposed in an even row.

Each of the second line groups CWG2 of the first display device 10-1 may correspond to an area between the first line groups CWG1 of the second display device 10-2. Each of the second line groups CWG2 of the first display device 10-1 may face a side surface of the second display device 10-2.

Each of the first line groups CWG1 of the second display device 10-2 may correspond to an area between the second line groups CWG2 of the first display device 10-1. Each of the first line groups CWG1 of the second display device 10-2 may face the other side surface of the first display device 10-1.

The width G1 of each of the second line groups CWG2 of the first display device 10-1 may be smaller than the distance L2 between the first line groups CWG1 of the second display device 10-2. The width G2 of each of the first line groups CWG1 of the second display device 10-2 may be smaller than the distance L1 between the second line groups CWG2 of the first display device 10-1. For example, the width G1 of each of the second line groups CWG2 of the first display device 10-1 may be the same as the width G2 of each of the first line groups CWG1 of the second display device 10-2, but the disclosure is not limited thereto. The distance L1 between the second line groups CWG2 of the first display device 10-1 may be the same as the distance L2 between the first line groups CWG1 of the second display device 10-2, but the disclosure is not limited thereto.

In the tiled display device TD, the second line groups CWG2 of the first display device 10-1 and the first line groups CWG1 of the second display device 10-2 may be arranged or disposed to be staggered or offset or may alternate with each other, thereby minimizing electrical interference between the connection lines CWL. For example, the tiled display device TD may prevent the generation of capacitance between the second line groups CWG2 of the first display device 10-1 and the first line groups CWG1 of the second display device 10-2. The tiled display device TD may prevent an electrical short between the second line groups CWG2 of the first display device 10-1 and the first line groups CWG1 of the second display device 10-2.

According to the tiled display device of an embodiment, connection lines of display devices adjacent to each other may be arranged or disposed to be staggered or offset or may alternate with each other, thereby minimizing electrical interference between the connection lines. The tiled display device may have a pad unit, which may be disposed on the lower surface of a substrate and may be electrically connected to a thin film transistor of a pixel through the connection lines, and thus the bezel area or dead space of the display device may be minimized. Therefore, since the tiled display device may include connection lines that may be arranged or disposed to be staggered or offset or may alternate with each other, the interval between the display devices may be minimized, thereby preventing the user from recognizing the non-display area or the boundary portion between the display devices, and minimizing the electrical interference between the connection lines.

Although embodiments have been disclosed for illustrative purposes, those skilled in the art will appreciate that various modifications, additions and substitutions are possible, without departing from the scope and spirit of the disclosure as disclosed in the accompanying claims.

What is claimed is:

1. A tiled display device, comprising:
   a plurality of display devices each including a display area and a non-display area adjacent to the display area, the display area of each of the plurality of display devices including a pixel; and
   a substrate on which each of the plurality of display devices is disposed, wherein
   each of the plurality of display devices comprises:
      a thin film transistor layer disposed on the substrate and including a thin film transistor; and
      a connection line electrically connected to the thin film transistor and disposed in the non-display area on the substrate, and
   the connection line comprises:
      a first portion electrically connected to the thin film transistor and disposed on the thin film transistor layer;
      a second portion electrically connected to the first portion and disposed on a side surface of the substrate; and
      a third portion electrically connected to the second portion and disposed on a lower surface of the substrate, and
   the second portions of connection lines of display devices adjacent to each other among the plurality of display devices are staggered with respect to each other.

2. The tiled display device of claim 1, wherein
   the plurality of display devices comprises a first display device and a second display device adjacent to each other,
   the connection lines include:
      a plurality of first connection lines disposed at a side surface of the first display device; and
      a plurality of second connection lines disposed at a side surface of the second display device facing the side surface of the first display device, and
   the plurality of first connection lines and the plurality of second connection lines are staggered with respect to each other.

3. The tiled display device of claim 2, wherein each of the plurality of first connection lines corresponds to an area between the plurality of second connection lines.

4. The tiled display device of claim 2, wherein
   each of the plurality of first connection lines faces a side surface of the second display device, and
   each of the plurality of second connection lines faces a side surface of the first display device.

5. The tiled display device of claim 2, wherein
   each of the plurality of first connection lines is disposed in an odd row, and
   each of the plurality of second connection lines is disposed in an even row.

6. The tiled display device of claim 2, wherein a width of each of the plurality of first connection lines is smaller than a distance between each of the plurality of second connection lines.

7. The tiled display device of claim 2, wherein
   the first display device further includes a plurality of third connection lines disposed at another side surface of the first display device opposite to the side surface of the first display device, and the plurality of first connection lines and the plurality of third connection lines are symmetrically disposed with respect to the display area.

8. The tiled display device of claim 2, wherein
the first display device further includes a plurality of third connection lines disposed at another side surface of the first display device opposite to the side surface of the first display device,
the plurality of first connection lines and the plurality of third connection lines are staggered with respect to each other, and
the display area is disposed between the plurality of first connection lines and the plurality of third connection lines.

9. The tiled display device of claim 1, wherein
the plurality of display devices comprises a first display device and a second display device adjacent to each other,
the first display device comprises a plurality of first line groups each including a plurality of first connection lines and disposed at a side surface of the first display device,
the second display device comprises a plurality of second line groups each including a plurality of second connection lines and disposed at a side surface of the second display device facing the side surface of the first display device, and
the plurality of first line groups and the plurality of second line groups are staggered with respect to each other.

10. The tiled display device of claim 9, wherein each of the plurality of first line groups corresponds to an area between the plurality of second line groups.

11. The tiled display device of claim 9, wherein
each of the plurality of first line groups faces a side surface of the second display device, and
each of the plurality of second line groups faces a side surface of the first display device.

12. The tiled display device of claim 9, wherein
each of the plurality of first line groups is disposed in an odd row, and
each of the plurality of second line groups is disposed in an even row.

13. The tiled display device of claim 9, wherein a width of each of the plurality of first line groups is smaller than a distance between the plurality of second line groups.

14. The tiled display device of claim 9, wherein
the first display device further comprises a plurality of third line groups disposed at another side surface of the first display device opposite to the side surface of the first display device, and
the plurality of first line groups and the plurality of third line groups are symmetrically disposed with respect to the display area.

15. The tiled display device of claim 9, wherein
the first display device further comprises a plurality of third line groups disposed at another side surface of the first display device opposite to the side surface of the first display device,
the plurality of first line groups and the plurality of third line groups are staggered with respect to each other, and
the display area is disposed between the plurality of first line groups and the plurality of third line groups.

16. The tiled display device of claim 1, wherein
each of the plurality of display devices further comprises a light emitting element and a connection electrode electrically connecting the light emitting element to the thin film transistor, and
the first portion of the connection line and the connection electrode are disposed on a same layer.

17. The tiled display device of claim 1, wherein each of the plurality of display devices further comprises a protection member overlapping the side surface of the substrate and the second portion of the connection line in a direction perpendicular to the side surface of the substrate.

18. The tiled display device of claim 1, wherein each of the plurality of display devices further comprises:
a pad unit disposed on the lower surface of the substrate and electrically connected to the third portion of the connection line;
a flexible film disposed on the lower surface of the substrate and electrically connected to the pad unit; and
a source driver disposed on the flexible film and supplying a source voltage to the connection line.

19. The tiled display device of claim 1, wherein
the substrate comprises a recess recessed from a side surface of the substrate, and
the connection line includes:
a first portion electrically connected to the thin film transistor and disposed on the thin film transistor layer;
a second portion electrically connected to the first portion and disposed in the recess of the substrate; and
a third portion electrically connected to the second portion and disposed on a lower surface of the substrate.

20. The tiled display device of claim 19, wherein
each of the plurality of display devices further comprises an insulating layer disposed between the light emitting element layer and an upper surface of the substrate in a direction perpendicular to the upper surface of the substrate,
the insulating layer directly contacts a gate electrode of the thin film transistor,
the insulating layer comprises an other recess recessed from a side surface of the insulating layer, and
the second portion of the connection line is disposed in the other recess.

21. The tiled display device of claim 20, wherein
the recess and the other recess are axially aligned with one another, and
each of the recess and the other recess forms an arcuately shaped void.

* * * * *